US012707888B2

(12) United States Patent
Walter et al.

(10) Patent No.: US 12,707,888 B2
(45) Date of Patent: Aug. 11, 2026

(54) ASYMMETRIC DONOR-ACCEPTOR MOLECULAR DYES

(71) Applicant: THE UNIVERSITY OF NORTH CAROLINA AT CHARLOTTE, Charlotte, NC (US)

(72) Inventors: Michael G. Walter, Charlotte, NC (US); Nickolas A. Sayresmith, Charlotte, NC (US); Yamuna Krishnan, Chicago, IL (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 987 days.

(21) Appl. No.: 17/774,552

(22) PCT Filed: Nov. 6, 2020

(86) PCT No.: PCT/US2020/059443

§ 371 (c)(1),
(2) Date: May 5, 2022

(87) PCT Pub. No.: WO2021/092408

PCT Pub. Date: May 14, 2021

(65) Prior Publication Data

US 2022/0407014 A1 Dec. 22, 2022

Related U.S. Application Data

(60) Provisional application No. 62/932,900, filed on Nov. 8, 2019.

(51) Int. Cl.

| | |
|---|---|
| ***C09D 11/00*** | (2014.01) |
| ***C09D 11/16*** | (2014.01) |
| ***H10K 85/60*** | (2023.01) |

(52) U.S. Cl.

CPC .......... *H10K 85/655* (2023.02); *C09D 11/16* (2013.01); *H10K 85/656* (2023.02)

(58) Field of Classification Search

CPC .... H10K 85/655; H10K 85/656; H10K 59/00; C09D 11/16

(Continued)

(56) References Cited

U.S. PATENT DOCUMENTS

| | | | |
|---|---|---|---|
| 6,221,604 | B1 | 4/2001 | Upadhya et al. |
| 2016/0268057 | A1 | 9/2016 | Biagini et al. |

FOREIGN PATENT DOCUMENTS

| | | | |
|---|---|---|---|
| JP | 2017190315 | A * | 10/2017 |

OTHER PUBLICATIONS

Sayrewsmith et al.,J.Am.Che.Soc., 2019, 141, 18780-18790, as supplied by applicants (Year: 2019).*

(Continued)

*Primary Examiner* — James E McDonough

(74) *Attorney, Agent, or Firm* — J. Clinton Wimbish; Maynard Nexsen PC

(57) ABSTRACT

In one aspect, π-conjugated asymmetric molecular dyes are described herein comprising a donor (D)-acceptor (A) architecture across a thiazolothiazole electronic bridge. In some embodiments, a π-conjugated asymmetric molecular dye has a difference between the highest occupied molecular orbital (HOMO) and lowest unoccupied molecular orbital (LUMO) of at least 1.2 eV. In some embodiments, the HOMO-LUMO offset is 1.2 eV to 5 eV. The π-conjugated asymmetric molecular dye may also display a change in dipole moment between ground and excited states of at least 5 D.

13 Claims, 13 Drawing Sheets

$Bu_2N$-$TT_Z$-Py $Ph_2N$-$TT_Z$-COOH $Ph_2N$-$TT_Z$-Py $Ph_2N$-$TT_Z$-CHO

(58) Field of Classification Search
USPC .................. 106/31.014, 31.13, 31.27, 31.01
See application file for complete search history.

(56) References Cited

OTHER PUBLICATIONS

International Search Report and Written Opinion corresponding to PCT/US2020/059443, mailed Feb. 5, 2021, 8 pages.

Sayresmith et al., Photostable Voltage-Sensitive Dyes Based on Simple, Solvatofluorochromic, Asymmetric Thiazolothiazoles, Journal of the American Chemical Society, Oct. 29, 2019 (Oct. 29, 2019), vol. 141, pp. 18780-18790; Abstract p. 18781 p. 18782 p. 18783 p. 18785 p. 18787.

Dessi et al., Thiazolo[5,4-d]thiazole-based organic sensitizers with strong visible light absorption for transparent, efficient and stable dye-sensitized solar cells, RSC Advances, Mar. 31, 2015 (Mar. 31, 2015), vol. 5, pp. 32657-32668; Abstract p. 32658.

Pubmed Compound Record for CID 3569632, '3,6-Dimethyl-2,5-diphenyl-(1,3]thiazole[5,4-d][1,3]thiazole-3,6-diium', U.S. National Library of Medicine, Sep. 9, 2005 (Sep. 9, 2005), pp. 1-8 (https://pubchem.ncbi.nlm.nih.9ov/compound/3569632); p. 2.

* cited by examiner

D is an electron donor group made up of either C=C, alkynyl, aryl or heteroaryl containing 1-20 ring and may be substituted by one or more R groups. D may have one of the following structures:

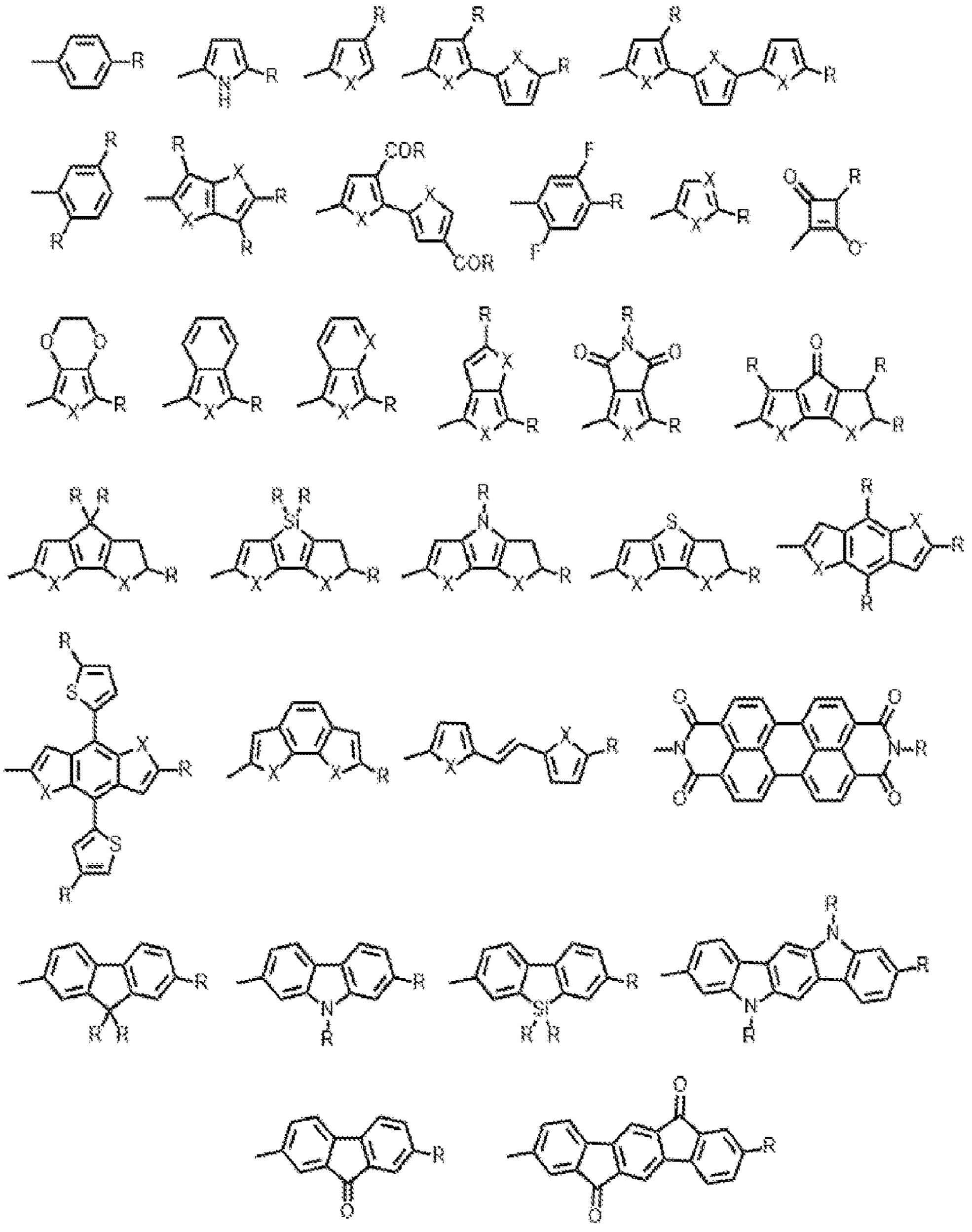

R or R1 denotes a H, Br, Cl, I, F, NO2, CN, NCS, NH2, CF3, polyethylene glycol (PEG), carboxy, azido or amine terminated PEG, COR2, COOR2, COOH, CONHR2, CONR2R3, NR2R3R4, straight chain, branched, substituted or unsubstituted alkyl groups from 1-40 carbon atom potentially consisting of one or more adjacent heteroatom substitutions and potentially consisting of one or more substituent R2 groups, aryl, heteroaryl, aryloxy, heteroaryloxy, O-aryl, O-heteroaryl, N-alkyl, N-aryl R2, R3, or R4 denotes H or alkyl groups from 1-40 carbon atoms, aryl groups X denotes O, NH, CH2, C-RR1, N-R, S, Se, Te

FIG. 1

A is an electron acceptor group. A can be C=C, alkynyl, aryl, heteroaryl with 1-20 rings and may be substituted by one or more R groups or one or more A groups. A may have one of the following structures:

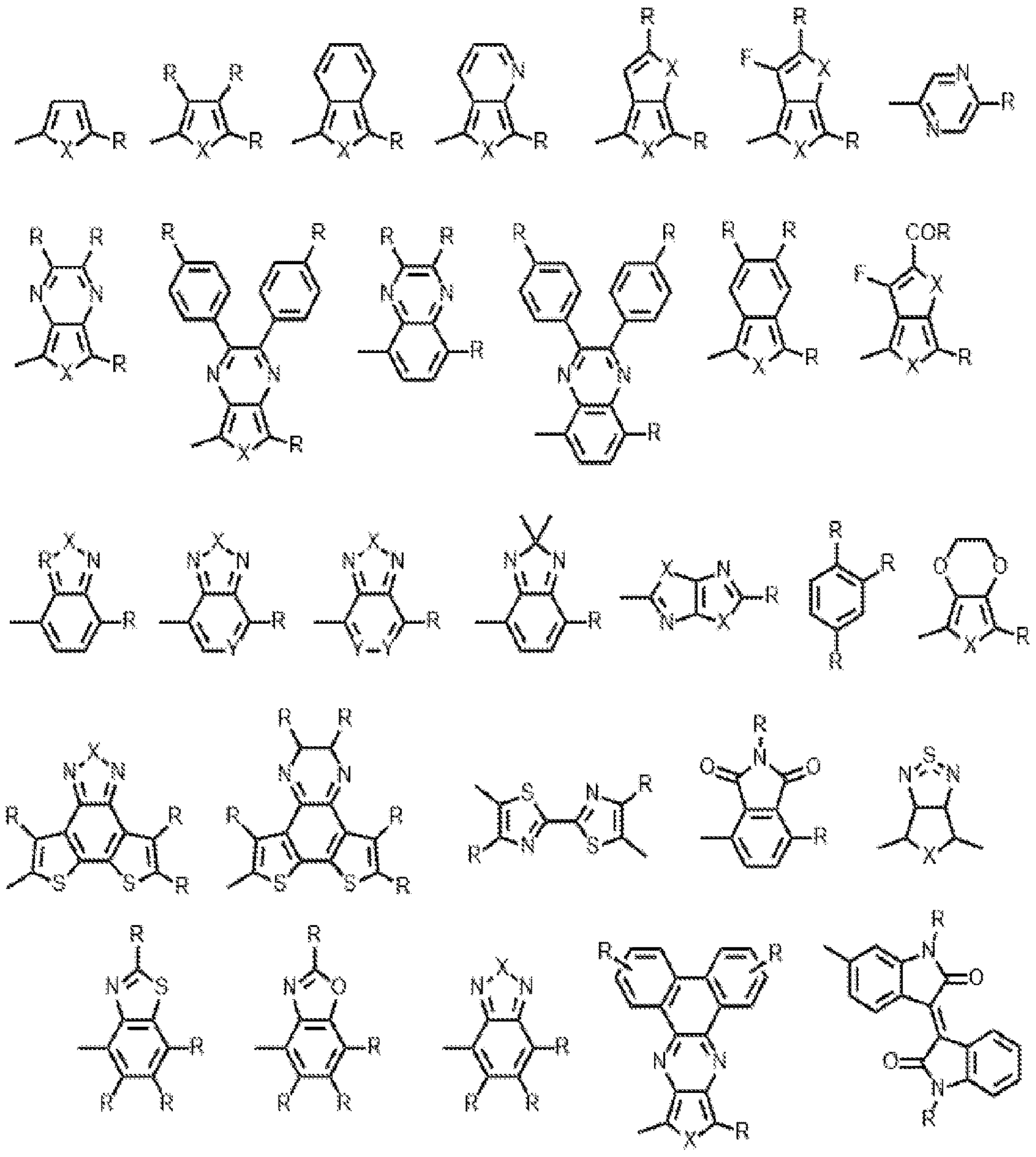

R or R1 denotes a H, Br, Cl, I, F, No2, CN, NCS, NH2, CF3, polyethylene glycol (PEG), carboxy, azido or amine terminated PEG, COR2, COOR2, COOH, CONHR2, CONR2R3, NR2R3R4, straight chain, branched, substituted or unsubstituted alkyl groups from 1-40 carbon atom potentially consisting of one or more adjacent heteroatom substitutions and potentially consisting of one or more substituent R2 groups, aryl, heteroaryl, aryloxy, heteroaryloxy, O-aryl, O-heteroaryl, N-alkyl, N-aryl R2, R3, or R4 denotes H or alkyl groups from 1-40 carbon atoms, aryl groups X denotes O, NH, CH2, C-RR1, N-R, S, Se, Te

FIG. 2

1
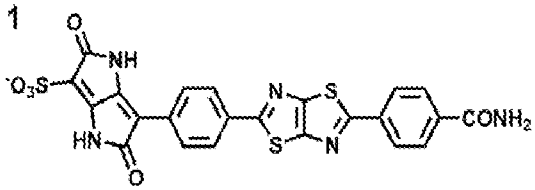
2
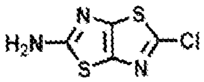
3
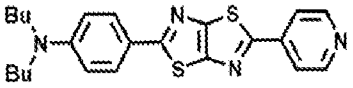
4
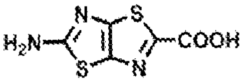
5
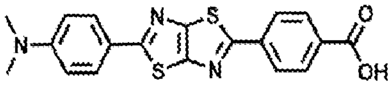
6
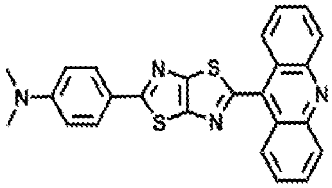
7
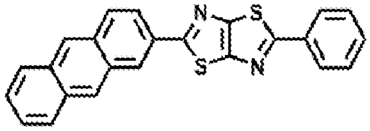
8
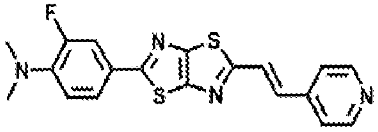
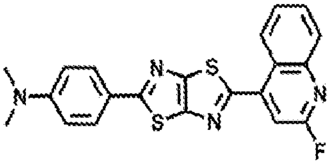
9
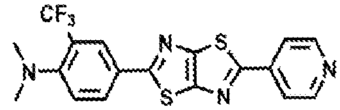
10
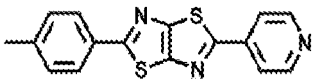
11
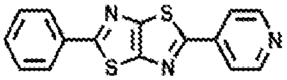
12
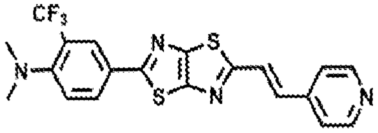
13
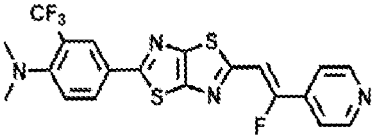
14
15
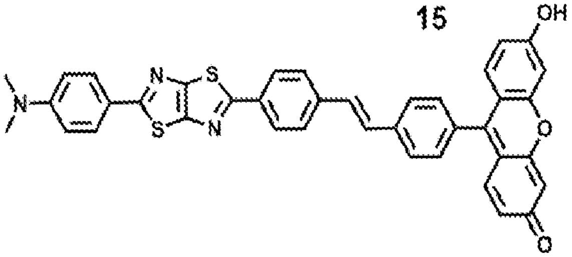
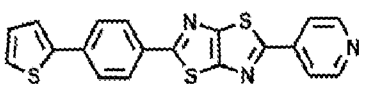
16
FIG. 3

17
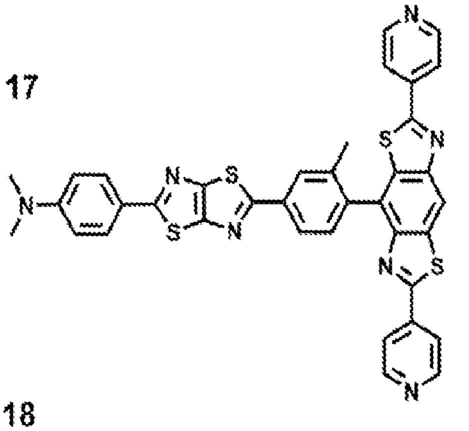
18
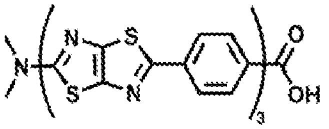
19
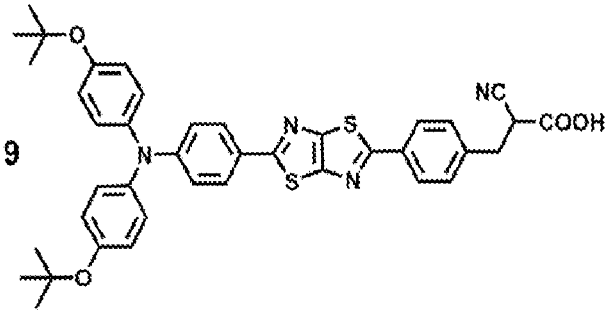
20
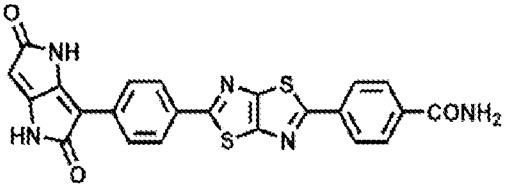
21
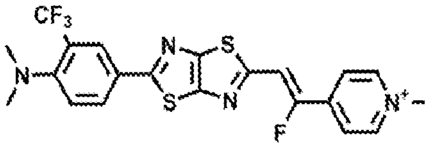
22
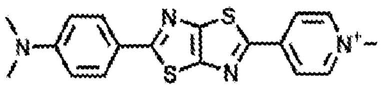
23
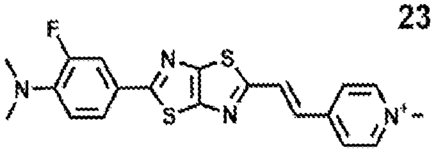
24
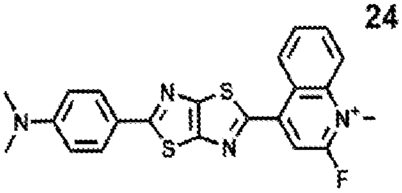
25
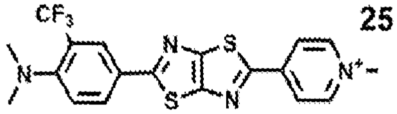
26
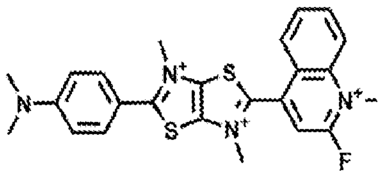
27
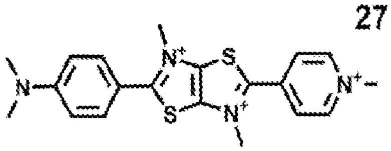
28
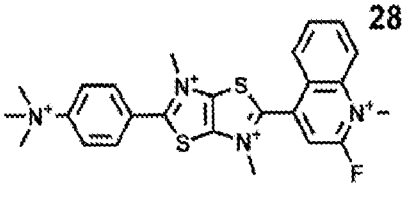
29
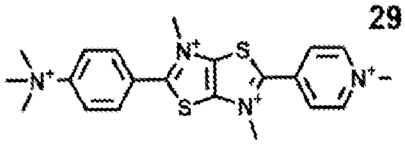
FIG. 3 CONT.

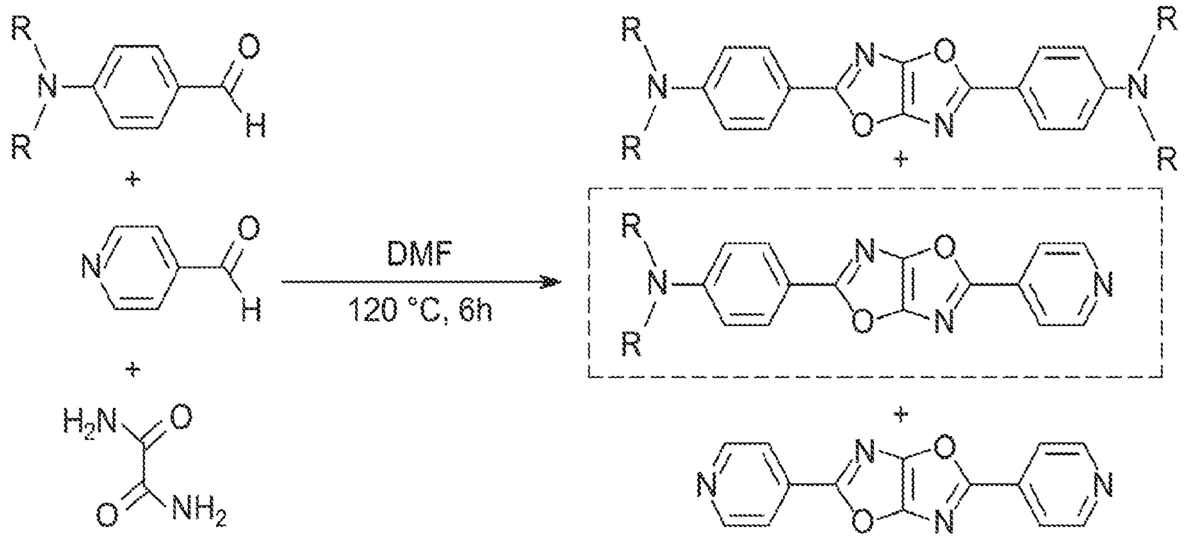
FIG. 5
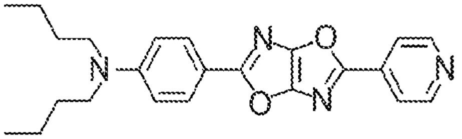
Bu$_2$N-TT$_Z$-Py
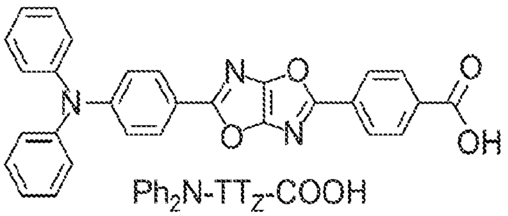
Ph$_2$N-TT$_Z$-COOH
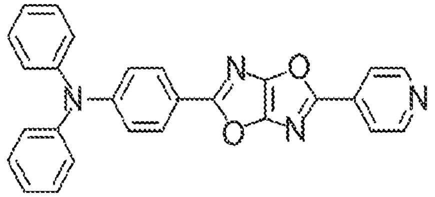
Ph$_2$N-TT$_Z$-Py
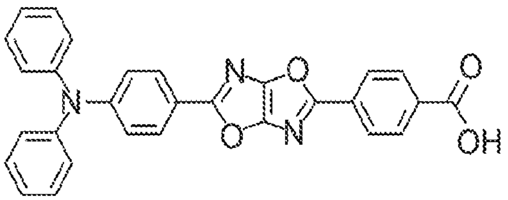
Ph$_2$N-TT$_Z$-CHO
FIG. 6

| | | Polarizability factor | Abs (nm) | Abs (eV) | Ext Coeff. ($M.cm^{-1}$) | EM (eV) | EM (eV) | Stokes shift (eV) | | Fluorescence lifetime (ns) | Radiative rate ($sec^{-1}$) | Non-radiative rate ($sec^{-1}$) | |
|---|---|---|---|---|---|---|---|---|---|---|---|---|---|
| dye | Solvent | $\Delta f^*$ | $\lambda_{max}$ | $E_{ex}$ | $\varepsilon$ | $\lambda_{max}$ | $E_{em}$ | SS | $\phi_F$ | $\tau_F$ | $K_r$ | $K_{nr}$ | |
| | hexane | -0.00170 | 410 | 3.024 | 22000 | 450 | 2.756 | 0.269 | 0.93 | 1.50 | 6.2E+08 | 4.4E+07 | |
| $Bu_2N$ | DCM | 0.217 | 429 | 2.890 | 13000 | 515 | 2.408 | 0.483 | 0.35 | 2.47 | 1.4E+08 | 2.6E+08 | |
| -TTz- | $CHCl_3$ | 0.148 | 430 | 2.884 | 18000 | 532 | 2.331 | 0.553 | 0.45 | 2.26 | 2.0E+08 | 2.4E+08 | |
| Py | MeCN | 0.305 | 425 | 2.918 | 20000 | 557 | 2.226 | 0.691 | 0.17 | 3.06 | 5.4E+07 | 2.7E+08 | |
| | MeOH | 0.309 | 424 | 2.925 | 21000 | 565 | 2.195 | 0.730 | 0.04 | 1.23 | 3.1E+07 | 7.8E+08 | |
| | | | | | | | | | | | | | |
| | toluene | 0.0132 | 419 | 2.959 | 36000 | 482 | 2.573 | 0.387 | 0.93 | 1.80 | 5.2E+08 | 3.9E+07 | |
| $Ph_2N$ | DCM | 0.217 | 422 | 2.938 | 34000 | 536 | 2.313 | 0.625 | 0.37 | 3.16 | 1.2E+08 | 2.0E+08 | |
| -TTz- | $CHCl_3$ | 0.148 | 424 | 2.925 | 46000 | 518 | 2.394 | 0.531 | 0.54 | 2.60 | 2.1E+08 | 1.8E+08 | |
| Py | EtoAc | 0.199 | 415 | 2.988 | 48000 | 518 | 2.394 | 0.594 | 0.55 | 2.80 | 2.0E+08 | 1.6E+08 | |
| | acetone | 0.284 | 415 | 2.988 | 35000 | 554 | 2.238 | 0.750 | 0.17 | 2.70 | 6.3E+07 | 3.1E+08 | |
| | | | | | | | | | | | | | |
| | toluene | 0.0132 | 424 | 2.925 | 22000 | 487 | 2.546 | 0.378 | 0.78 | 1.70 | 4.6E+08 | 1.3E+08 | |
| $Ph_2N$ | DCM | 0.217 | 424 | 2.925 | 21000 | 523 | 2.371 | 0.554 | 0.33 | 2.90 | 1.1E+08 | 2.3E+08 | |
| -TTz- | $CHCl_3$ | 0.148 | 425 | 2.918 | 14000 | 548 | 2.263 | 0.655 | 0.55 | 2.20 | 2.5E+08 | 2.0E+08 | |
| COOH | iPrOH | 0.272 | 417 | 2.974 | 16000 | 522 | 2.375 | 0.598 | 0.37 | 2.40 | 1.5E+08 | 2.6E+08 | |
| | MeOH | 0.309 | 414 | 2.995 | 17000 | 535 | 2.318 | 0.677 | 0.11 | 1.80 | 6.1E+07 | 4.9E+08 | |
| | | | | | | | | | | | | | |
| | Tol | 0.0133 | 425 | 2.918 | 80000 | 501 | 2.475 | 0.443 | 0.72 | 1.89 | 3.8E+08 | 1.5E+08 | |
| $Ph_2N$ | ClBz | 0.143 | 436 | 2.844 | 18000 | 552 | 2.371 | 0.554 | 0.33 | 2.54 | 1.3E+08 | 2.6E+08 | |
| -TTz- | $Cl_2Bz$ | 0.186 | 440 | 2.818 | 37000 | 556 | 2.263 | 0.655 | 0.18 | 2.84 | 6.3E+07 | 2.9E+08 | |
| CHO | EtOAc | 0.200 | 428 | 2.897 | 86000 | 548 | 2.263 | 0.634 | 0.36 | 3.09 | 4.2E+07 | 7.5E+07 | |
| | DCM | 0.217 | 434 | 2.857 | 35000 | 560 | 2.214 | 0.643 | 0.13 | 2.40 | 1.5E+08 | 1.0E+09 | |
| | | | | | | | | | | | | | |

FIG. 8

ASYMMETRIC DONOR-ACCEPTOR MOLECULAR DYES

RELATED APPLICATION DATA

This application is a U.S. National Phase of PCT/US2020/059443, filed Nov. 6, 2020, which claims priority pursuant to Article 8 of the Patent Cooperation Treaty to U.S. Provisional Patent Application Ser. No. 62/932,900 filed Nov. 8, 2019, each of which is incorporated herein by reference in its entirety.

FIELD

The present invention relates to molecular dyes and, in particular, to asymmetric donor-acceptor dyes comprising thiazolothiazole electronic bridges.

BACKGROUND

Small molecule fluorophores are attractive molecular tools for environmental sensing applications and biosensing/bioimaging techniques due to their high microenvironmental sensitivity, selectivity, and temporal resolution. Fluorescent molecules can either turn on/off their fluorescence or chromically shift their emission through the binding or interaction of various metal ions, reactive oxygen species, organic toxins, or cell organelles/membranes, and can greatly enhance cell fluorescence microscopic imaging. Molecular sensors with large fluorescence Stokes shifts are advantageous for these applications due to a low overlap between excitation and emission.

Molecular materials containing the fused, multiheterocyclic backbones have exhibited strong fluorescence and electrofluorochromism, and have been used in a variety of applications such as light-harvesting dyes in photovoltaics, redox flow batteries, and molecular sensors. However, these molecular species often require tedious multistep synthetic methods. Additionally, the synthetic methods generally produce molecular species exhibiting $C_{2v}$ and/or $D_{2h}$ symmetry across the heterocyclic backbone. Such symmetry can preclude fabrication of donor-acceptor architectures.

SUMMARY

In one aspect, π-conjugated asymmetric molecular dyes are described herein comprising a donor (D)-acceptor (A) architecture across a thiazolothiazole electronic bridge. In some embodiments, a π-conjugated asymmetric molecular dye is of Formula I.

(I)

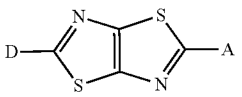

wherein D is an electron donor and A is an electron acceptor, the π-conjugated asymmetric molecular dye having a difference between the highest occupied molecular orbital (HOMO) and lowest unoccupied molecular orbital (LUMO) of at least 1.2 eV. In some embodiments, the HOMO-LUMO offset is 1.2 eV to 5 eV.

In another aspect, a π-conjugated asymmetric molecular dye is of Formula I:

(I)

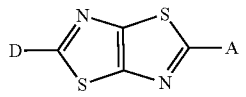

wherein D is an electron donor and A is an electron acceptor, the π-conjugated asymmetric molecular dye having exhibiting a change in dipole moment between ground and excited states of at least 5 D. In some embodiments, the change in dipole moment is from 5 D to 40 D or 10 D to 40 D.

The π-conjugated asymmetric molecular dyes can comprise any electron donor moiety (D) and electron acceptor moiety (A) resulting in electronic structure and associated properties described herein. In being asymmetric, the electron donor (D) and the electron acceptor (A) are different moieties. In some embodiments, the electron donor and electron acceptor are independently selected from the group consisting of aryl and heteroaryl. Moreover, in some embodiments, one or both nitrogens of the thiazolothiazole bridging the D and A can be substituted with a substituent selected from the group consisting of alkyl, heteroalkyl, cycloalkyl, heterocycloalkyl, alkenyl, heteroalkenyl, cycloalkenyl, heterocycloalkenyl, aryl, and heteroaryl.

In another aspect, methods of making π-conjugated asymmetric molecular dyes are provided. A method, in some embodiments, comprises providing an electron donor precursor, and an electron acceptor precursor, and coupling the electron donor precursor and the electron acceptor precursor via reaction with dithiooxamide to provide the π-conjugated asymmetric molecular dye of Formula (I)

(I)

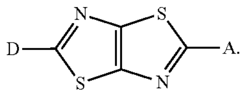

wherein D is an electron donor and A is an electron acceptor. In some embodiments, the electron donor precursor, electron acceptor precursor, and dithiooxamide form a single reaction mixture, and the formation of the π-conjugated asymmetric molecular dye is administered in a single step.

In a further aspect, biological compositions are described herein. In some embodiments, a biological composition comprises cells or cellular components, and a marker associated with membranes of the cells or cellular components, the marker comprising a R-conjugated asymmetric molecular dye of Formula I:

(I)

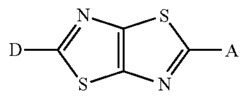

wherein D is an electron donor and A is an electron acceptor.

These and other embodiments are further described in the following detailed description.

BRIEF DESCRIPTION OF THE DRAWINGS

FIG. 1 illustrates donor species (D) for use in π-conjugated asymmetric molecular dyes according to some embodiments.

FIG. 2 illustrates acceptor species (A) for use in π-conjugated asymmetric molecular dyes according to some embodiments.

FIG. 3 illustrates π-conjugated asymmetric molecular dyes having structure described herein according to some embodiments.

FIG. 5 provides a synthetic scheme for producing π-conjugated asymmetric molecular dyes described herein, according to some embodiments.

FIG. 6 illustrates π-conjugated asymmetric molecular dyes produced according to the method of FIG. 5, according to some embodiments.

FIG. 8 provides a table summarizing optical properties of asymmetric dyes in various solvents, according to some embodiments.

DETAILED DESCRIPTION

Figure 4:
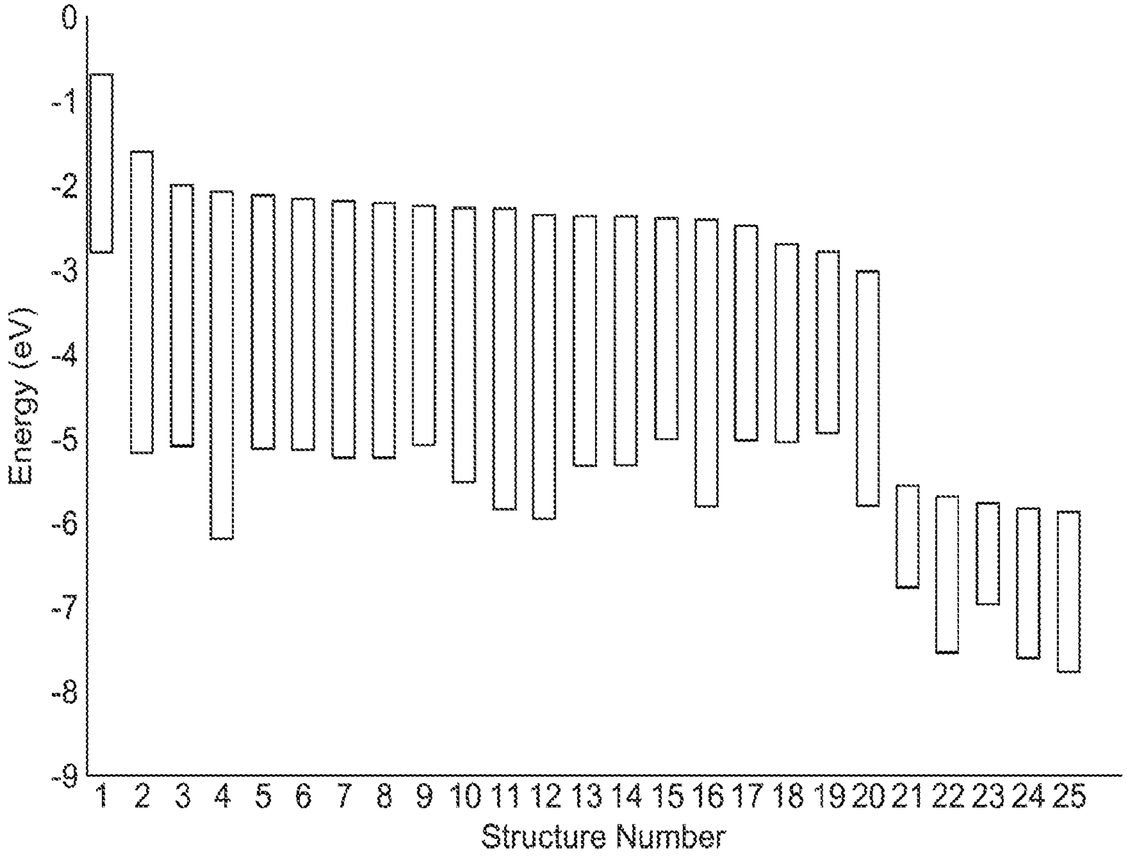
FIG. 4 illustrates HOMO-LUMO difference of the asymmetric dyes illustrated in FIG. 3.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Definitions

The term "alkyl" as used herein, alone or in combination, refers to a straight or branched saturated hydrocarbon group. For example, an alkyl can be $C_1$-$C_{30}$.

The term "alkenyl" as used herein, alone or in combination, refers to a straight or branched chain hydrocarbon group having at least one carbon-carbon double bond.

The term "aryl" as used herein, alone or in combination, refers to an aromatic monocyclic or multicyclic ring system optionally substituted with one or more ring substituents The term "cycloalkyl" as used herein, alone or in combination, refers to a non-aromatic, saturated mono- or multicyclic ring system optionally substituted with one or more ring substituents.

The term "cycloalkenyl" as used herein, alone or in combination, refers to a non-aromatic, mono- or multicyclic ring system having at least one carbon-carbon double bond and is optionally substituted with one or more ring substituents.

The term "heterocycloalkyl" as used herein, alone or in combination, refers to a non-aromatic, saturated mono- or multicyclic ring system in which one or more of the atoms in the ring system is an element other than carbon, such as nitrogen, oxygen or sulfur, alone or in combination, and wherein the ring system is optionally substituted with one or more ring substituents.

The term "heterocycloalkenyl" as used herein, alone or in combination, refers to a non-aromatic, mono- or multicyclic ring system in which one or more of the atoms in the ring system is an element other than carbon, such as nitrogen, oxygen or sulfur, alone or in combination, and which contains at least one carbon-carbon double bond in the ring system and wherein the ring system is optionally substituted with one or more ring substituents.

The term "heteroalkyl" as used herein, alone or in combination, refers to an alkyl moiety as defined above, having one or more carbon atoms, for example one, two or three carbon atoms, replaced with one or more heteroatoms, which may be the same or different.

The term "multicyclic ring system" as used herein, alone or in combination, refers to fused ring systems or non-fused ring systems linked together by one or more spacer moieties.

I. Asymmetric Molecular Dyes

π-conjugated asymmetric molecular dyes are described herein comprising a donor (D)-acceptor (A) architecture across a thiazolothiazole electronic bridge. In some embodiments, a π-conjugated asymmetric molecular dye is of Formula I.

(I)

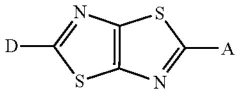

wherein D is an electron donor and A is an electron acceptor. Donor and acceptor moieties can be selected to provide asymmetric dyes the desired electronic structure and associated properties described herein. In some embodiments, D and A are independently selected from aryl and heteroaryl.

In some embodiments, for example, D is selected from monocyclic, bicyclic or polycyclic aryl or monocyclic, bicyclic or polycyclic heteroaryl. The aryl and heteroaryl structures can be fused or linked. In some embodiments, D is selected from the group consisting of aniline, pyrrole, thiophene, 3-substituted thiophene, bithiophene, terthiophene, selenophene, 3-substituted selenophene, isothianaphthene, p-phenylenevinylene, and ethylenedioxythiophene, Non-limiting examples of donor species (D) are further illustrated in FIG. 1. In the structures of FIG. 1, X can be O, N, S or Se. In some embodiments comprising more than one X, each X can independently be O, N, S, Se or Te. In addition, R, $R_1$, $R_2$ and $R_3$ can be independently selected from the group consisting of hydrogen, alkyl, alkenyl, aryl, heteroaryl, O-alkyl, O-alkenyl, and O-aryl. An alkyl, alkenyl, aryl, heteroaryl, O-alkyl, O-alkenyl, or O-aryl group, in some embodiments, comprises between 1 and 30 carbon atoms or between 1 and 15 carbon atoms.

In some embodiments, A is selected from monocyclic, bicyclic or polycyclic aryl or monocyclic, bicyclic or polycyclic heteroaryl. The aryl and heteroaryl structures, can be fused or linked. A, for example, can be selected from the group consisting of pyridine, substituted pyridine, pyrrole, aniline, thiophene, ethlyenedioxythiophene, p-phenylenevinylene, benzothiadiazole, pydridinethiadiazole, pyridine-selenadiazole, benzoxadiazole, and benzoselenadiazole. Non-limiting examples of acceptor species (A) are further illustrated in FIG. 2. In the structures of FIG. 2, X can be O, N, S, Se or Te. In some embodiments comprising more than one X, each X can independently be O, N, S or Se. In addition, R, $R^1$ and $R^2$ can independently be selected from the group consisting of hydrogen, alkyl, alkenyl, aryl, heteroaryl, O-alkyl, O-alkenyl, and O-aryl. An alkyl, alkenyl, aryl, heteroaryl, O-alkyl, O-alkenyl, or O-aryl group, in some embodiments, comprises between 1 and 30 carbon atoms or between 1 and 15 carbon atoms.

FIG. 3 illustrates various non-limiting examples of t-conjugated asymmetric molecular dyes falling under Formula (I) according to some embodiments. As described herein, a π-conjugated asymmetric dye of Formula (I) can exhibit a difference between the HOMO and LUMO of at least 1.2 eV. In some embodiments, the HOMO-LUMO offset has a value selected from Table I.

TABLE I

| HOMO/LUMO Energy Difference (eV) |
|---|
| 1.2-5 |
| 1.5-5 |
| 2-5 |
| 2.5-5 |
| 3-5 |
| 2-4 |
| 3-4 |

FIG. 4 illustrates electronic structures and HOMO-LUMO differences of the asymmetric dyes illustrated in FIG. 3.

Alternatively, a π-conjugated asymmetric dye of Formula (I) can display a change in dipole moment between ground and excited states of at least 5 D. The change in dipole moment can also have a value selected from Table II.

TABLE II

| Change in Dipole Moment (D) |
|---|
| 5-40 |
| 10-40 |
| 13-40 |
| 14-40 |
| 14.5-40 |
| 15-40 |
| 16-40 |
| 17-40 |
| 18-40 |

In some embodiments, an asymmetric dye of Formula (I) can exhibit both a HOMO-LUMO difference and change in dipole moment described herein.

Asymmetric dyes of Formula (I) are fluorophores, in some embodiments. Moreover, fluorophores of Formula (I) can have a peak absorption in the range of 360 nm to 650 nm, and a peak emission in the range of 420 nm to 800 nm. In some embodiments, the absorption profile of a fluorophore of Formula (I) does not overlap or substantially overlap with the emission profile. Absorption and emission profiles of an asymmetric dye do not substantially overlap if less than 10 percent or less than 5 percent of the profiles have overlap. Additionally, fluorophores of Formula (I) can exhibit solvent dependent fluorescence lifetimes. Fluorescence lifetime can vary relative to solvent polarity, in some embodiments. Fluorophores of Formula (I) can display solvatofluorochromism, exhibiting a Stokes shift of 0.25 to 0.75 eV, in some embodiments. The π-conjugated asymmetric molecular dyes can exhibit quantum yields greater than 80 percent, greater than 85 percent, or greater than 90 percent in non-polar solvents.

Dependent on D-A selection, π-conjugated asymmetric molecular dyes described herein can be amphiphilic. The amphiphilic nature of the dyes can facilitate interaction with various biomolecular structures, including phospholipid bilayers of cells, and/or liposomes. Additionally, asymmetric dyes described herein can be functionalized with various click chemistries and/or other targeting moieties for localizing the dyes in the desired environment for labeling. Click chemistry moieties include, but are not limited to, BCN, DBCO, TCO, tetrazine, alkyne, and azide, in some embodiments.

In some embodiments, one or both nitrogen atoms of the thiazolothiazole bridging the D and A are substituted with a substituent selected from the group consisting of alkyl, heteroalkyl, cycloalkyl, heterocycloalkyl, alkenyl, heteroalkenyl, cycloalkenyl, heterocycloalkenyl, aryl, and heteroaryl. Substitution on one or both of the nitrogen atoms can be employed to alter the hydrophilic or hydrophobic nature of the dyes. Substitution on the nitrogen can produce a quaternary amine, enabling various salt structures. Substituents on both nitrogen atoms may be the same or different. Additionally, quaternary amines and/or other charged structures may be imparted by substituents coupled to the ring nitrogen. In some embodiments, for example, the asymmetric dies can be zwitterionic.

π-conjugated asymmetric molecular dyes described herein can be employed in a variety of applications, including organic electronic application. The asymmetric dyes, for example, can be used in organic displays, photovoltaics, and other light sensitive devices. The asymmetric dyes can also be employed in biological compositions, as described hereinbelow.

II. Methods of Making Asymmetric Dyes

In another aspect, methods of making q-conjugated asymmetric molecular dyes are provided. A method, in some embodiments, comprises providing an electron donor precursor, and an electron acceptor precursor and coupling the electron donor precursor and the electron acceptor precursor via reaction with dithiooxamide to provide the π-conjugated asymmetric molecular dye of Formula (I)

(I)

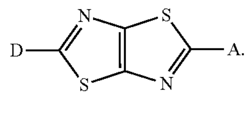

wherein D is an electron donor and A is an electron acceptor. In some embodiments, the electron donor precursor, electron acceptor precursor, and dithiooxamide form a single reaction mixture, and the formation of the π-conjugated asymmetric molecular dye is administered in a single step. In some embodiments, the electron donor precursor and electron acceptor precursor comprise aromatic aldehydes.

FIG. 5 provides a synthetic scheme for producing π-conjugated asymmetric molecular dyes described herein. As illustrated in FIG. 5, the electron donor precursor, electron acceptor precursor, and dithiooxamide form a single reaction mixture. The reaction mixture is heated to provide symmetric dyes and asymmetric dye. Liquid-phase column chromatography and/or other separation techniques can be employed to isolate the π-conjugated asymmetric molecular dye. Asymmetric dyes produced according to methods described herein can have any structure and/or properties described in Section I above.

These and other embodiments are further illustrated in the following non-limiting examples.

Examples—Asymmetric Dyes

A family of highly fluorescent, solvatofluorochromic, push-pull TTz compounds falling under Formula (I) herein were synthesized using a simple, single-step reaction (FIG. 5). The synthetic strategy began by heating two different, readily available aromatic aldehyde precursors with dithiooxamide resulting in one asymmetric and two symmetric TTz chromophores. Judicious selection of the aromatic aldehyde precursors yields in an amphiphilic, asymmetric TTz whose fluorescence on a column is uniquely distinguishable and whose column retention is intermediate that of its symmetric counterparts. In this way, silica gel chromatography gave an easily identifiable asymmetric TTz band (yellow fluorescence) in the middle of two spatially distant symmetric TTz bands (both with blue fluorescence). Four push-pull asymmetric TTz compounds were obtained in this manner ($Bu_2N$-TTz-Py, $Ph_2N$-TTz-Py, $Ph_2N$-TTz-COOH, and $Ph_2N$-TTz-CHO—FIG. 6) containing various electron-donating groups (dibutylamino, diphenylamino) and electron-withdrawing groups (pyridine, benzoic acid, and carboxaldehyde). The unique structural features of these chromophores compared to similar push-pull compounds composed of hydrocarbons is the highly fluorescent, electron deficient, heterocyclic TTz bridge connecting the two asymmetric functional groups, whereby the lack of hydrogens in the TTz bridge allows for enhanced planarity by minimizing any steric effects typical of hydrocarbons.

The rigid, fused-thiazole, bicyclic aromatic structure provides thermo-oxidative stability and the increased planarity further enhances the electronic interactions across the dye. This means that compared to typical hydrocarbon-based, fluorescent biological dyes, the TTz dyes presented herein demonstrate much larger Stokes shifts, enhanced absorption coefficients, and red-shifted absorption and emission. In addition, the thiazolothiazole bicyclic ring system provides further chemical functionality in a compact, π-conjugated bridge. All these properties make asymmetric TTzs a synthetically simple, photochemically attractive, and novel class of dyes suitable for environmental and biological sensing.

As provided above, the asymmetric, push-pull TTzs were accessed via one-pot syntheses which include, in each instance, a donor aromatic aldehyde (D-BzCHO), an acceptor aromatic aldehyde (A-BzCHO), and dithiooxamide. Initial asymmetric TTz reactions relied on modifying the literature procedure to accommodate a mixed-aldehyde approach, i.e. using an equivalent molar excess of the aromatic aldehydes compared to dithiooxamide (3:2:3). Although accessed simply, the overall yields (2-26%) of the asymmetric TTzs (a-TTzs) were limited by the simultaneous formation of their symmetric counterparts (generalized within as $D_2$-TTz and $A_2$-TTz). The yields of $Bu_2N$-TTz-Py and $Ph_2N$-TTz-CHO were significantly lower than $Ph_2N$-TTz-Py and $Ph_2N$-TTz-COOH. In the case of $Ph_2N$-TTz-CHO, further reaction and polymerization of the carboxaldehyde functionality likely hinders the overall yield. To better understand the synthesis of $Bu_2N$-TTz-Py, NMR studies were performed (see FIG. S29) and show that the rates of reactivity of dibutylaminobenzaldehyde ($Bu_2NBzCHO$, the D-BzCHO) and pyridinecarboxaldehyde (PyCHO, the A-BzCHO) differ such that the formation of $Py_2$-TTz ($A_2$-TTz) is favored over the a-TTz and $D_2$-TTz formation. Another consequence of preferential $A_2$-TTz formation is that A-BzCHO may become the limiting reagent for the a-TTz reaction, thus leading to $D_2$-TTz becoming the secondary product. With these considerations in mind, the synthesis of $Bu_2N$-TTz-Py was studied by using an excess of $Bu_2NBzCHO$ (1.25 to 1 to 5 mol ratio—PyCHO, dithiooxamide, $Bu_2NBzCHO$). NMR of the crude product shows a TTz ratio of 3:1:1 [$Py_2$-TTz, $Bu_2N$-TTz-Py, $(Bu_2N)_2$-TTz] with significant amounts of unreacted $Bu_2NBzCHO$ starting material and impurities/side products. To inhibit the formation of side products, promote complete oxidation, and encourage better final yields; the reaction was modified by reacting under $N_2$, adding dithiooxamide after heating to 120° C., and oxidizing with DDQ after 4 h of reaction time. According to an NMR of the crude product the reaction proceeded more cleanly and resulted in a product ratio of 1.14 to 1 to 0.44 [$Py_2$-TTz, $Bu_2N$-TTz-Py, $(Bu_2N)_2$-TTz].

Figure 7A:
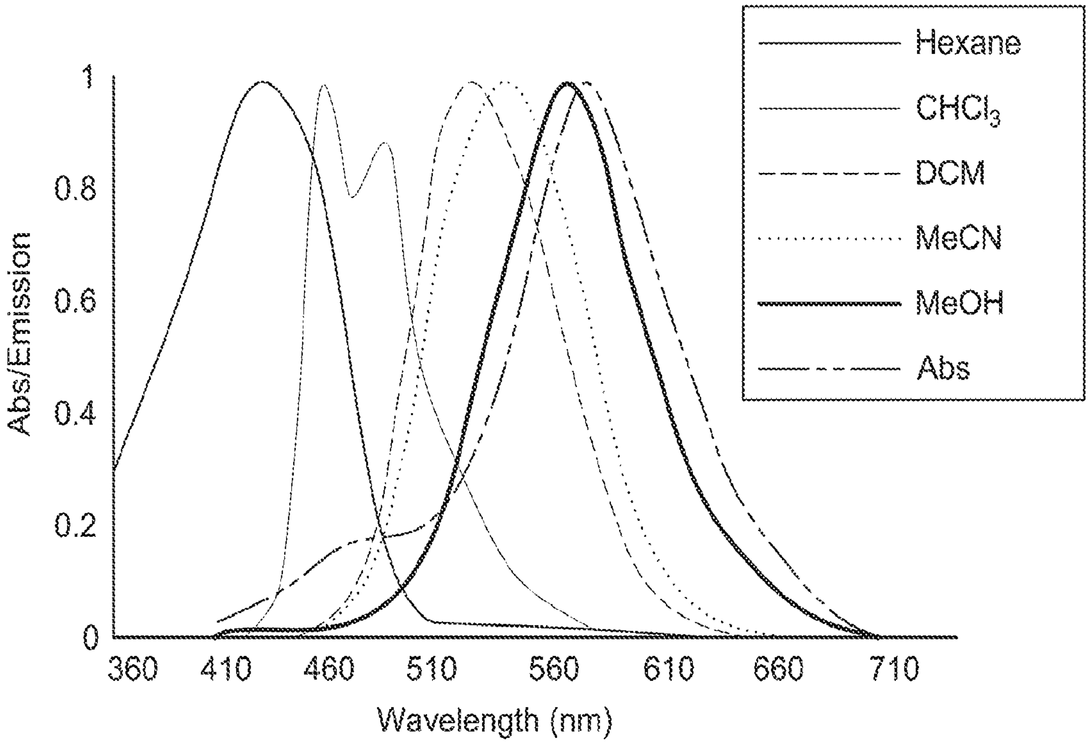
FIG. 7A provides normalized UV-Vis absorbance and fluorescence emission of asymmetric dyes in various solvents, according to some embodiment.
Figure 7B:
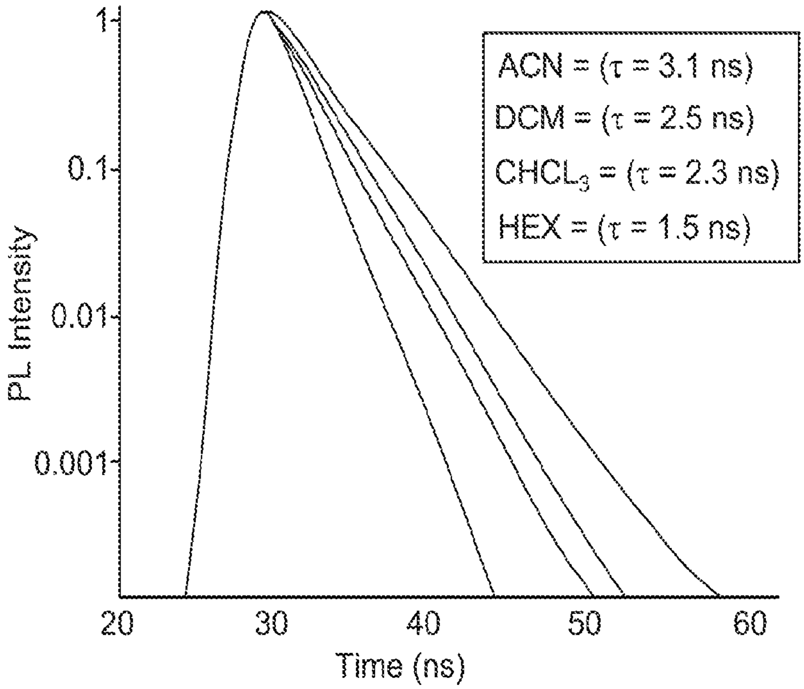
FIG. 7B details fluorescence lifetimes of asymmetric dyes in various solvents, according to some embodiments.

The absorption, emission, and fluorescence lifetime characteristics of all four TTz dyes were recorded in a variety of organic solvents (FIGS. 7A-7B, Table of FIG. 8). Additionally, HOMO/LUMO levels of the TTz dyes were determined computationally in Spartan 16 using B3LYP/6-31g. Molar absorptivities of all the TTz dyes ranged from 13,000 to 86,000 $cm^{-1}M^{-1}$. In comparison, the molar absorptivities of dipyridyl-TTz (in pyridine) and its alkylated derivatives (in $H_2O$) range from 32,000 to 46,000 $cm^{-1}M^{-1.16}$ Interestingly, the peak molar absorptivities of $Ph_2N$-TTz-Py were two or more times greater than the peak molar absorptivities of both $Bu_2N$-TTz-Py and $Ph_2N$-TTz-COOH, while those of $Ph_2N$-TTz-CHO were over four-fold greater than $Bu_2N$-TTz-Py and $Ph_2N$-TTz-COOH in some solvents. TTz dyes containing the diphenyl substituted donor amine exhibited an increased molar absorptivity compared to the dibutyl substituted donor amine. However, the peak absorbance of $Bu_2N$-TTz-Py in DCM was slightly red-shifted as compared to that of $Ph_2N$-TTz-Py ($\lambda_{max,\ abs}$=429 nm vs $\lambda_{max,\ abs}$=422 nm in DCM), which is attributed to the diphenylamine moiety having weaker donor characteristics. The pyridyl and formylbenzyl acceptor moieties enhance the molar absorptivities of the TTz dyes relative to the benzoic acid TTz derivative Additionally, $Ph_2N$-TTz-CHO demonstrated the most red-shifted peak absorbance ($\lambda_{max,\ abs}$=434 nm in DCM), which is attributed to the 4-formylbenzyl moiety having stronger acceptor characteristics. Due to the low estimated ground state dipole moments of the TTz dyes (μ=6-8 D), their wavelengths of absorbance remained relatively solvent independent (st. dev.=±11 nm).

The TTz dyes exhibit high quantum yields (QYs) in nonpolar solvents; however, as the polarity of the solvent increases, the emission intensities and, correspondingly, the QYs decrease (e.g. for $Bu_2N$-TTz-Py: $\Phi_{hex}$=0.93, $\Phi_{MeOH}$=0.04). The decrease in the QY is common for dyes with strong excited-state ICT character.[12, 48-49] In spite of having low QYs in polar solvents, the TTz dyes could be expected to perform well in applications where they are localized to nonpolar environments (e.g. cell membranes); whereby their fluorescence would increase upon localization and any unlocalized dyes would contribute little background noise.[47]

TCSPC measurements of the TTz dyes show a general upward trend for fluorescent lifetimes as the polarity increases in aprotic solvents—from 1.50-1.89 ns in nonpolar solvents to ~3.00 ns in polar, aprotic solvents (Table of FIG. 8). The fluorescence lifetimes in protic solvents have the opposite trend; that is, a decrease in the fluorescence lifetime as the polarity increases (e.g. for $Ph_2N$-TTz-COOH: $\tau_{f,\ iPrOH}$=2.40 ns, $\tau_{f,\ MeOH}$=1.80 ns). The trend reversal in the fluorescence lifetime can most likely be attributed to the presence of hydrogen bonding in protic solvents. Due mostly to large changes in the QYs, but also to increasing fluorescent lifetimes in more polar aprotic solvents, the radiative rates ($k_r$) decrease relatively significantly with increasing solvent polarity. At the same time, the non-radiative rates of each TTz generally increases as solvent polarity increases. As with the asymmetric TTz dyes, it has been shown that neutral red (NR), another ICT dye, shows a similar trend. Regardless, the fact that the fluorescence lifetimes are solvent dependent opens up the possibility of using these TTz dyes for measuring micelle formation and viscosity in living cells using fluorescence lifetime imaging (FLIM).

The presence of dual fluorescence and its dependence on solvent polarity is a well-documented phenomenon in many singly bonded D-A molecules with excited states that have highly dipolar quinoidal structures. The higher frequency peak in nonpolar solvents can mostly be attributed to the locally excited (LE) state, whereas the lower frequency peak can mostly be attributed to the ICT state. As is typically seen in similar D-A systems, it is suspected that the ICT state in the asymmetric TTz dye system is stabilized by the solvating effect of the polar solvent, thus causing the emission intensities of the dyes to broaden, diminish, and shift bathochromically with increasing solvent polarity. Another consequence of having electronically separated LE and ICT states is that the fluorescence lifetimes can increase in high-polar solvents even though the QYs are decreasing likewise; whereas, in typical non-ICT systems the fluorescence lifetimes and QYs are directly related.

As shown in FIG. 7A and listed in the table of FIG. 8, the TTz dyes exhibit strong solvatofluorochromism—of which $Ph_2N$-TTz-Py shows the largest Stokes shift of the four TTz dyes (0.750 eV). The calculated HOMOs/LUMOs indicate that the strong solvatofluorochromism arises from an ICT mechanism, whereby the ground state has significant electron localization on the donor side of the molecule whereas the electron density shifts to the acceptor moiety in the excited state. To more directly quantify the strong ICT character of the TTz dyes, the excited-state dipole moments were calculated using the Lippert-Mataga equation (Eq 1):

$$v_a - v_f = \frac{(\mu^* - \mu)^2}{4\pi\epsilon_0 hca^3}\Delta f + \text{const.}\ ;\ \Delta f = \left(\frac{\epsilon - 1}{2\varepsilon + 1} - \frac{\eta^2 - 1}{2\eta^2 + 1}\right)$$

where $v_a$ and $v_f$ are the wavenumbers of the absorption and emission peaks in $cm^{-1}$, respectively; μ* and μ are the excited state and ground state dipoles, respectively; $\epsilon_0$ is the vacuum permittivity, h is Planck's constant, c is the speed of light, a is the Onsager cavity radius, Δf is the orientation polarizability, ϵ is the relative permittivity, and η is the refractive index. The dipoles were calculated using Spartan 2016 software, and the Onsager cavity radii were calculated using Gaussian '09 software.

Figure 9A:
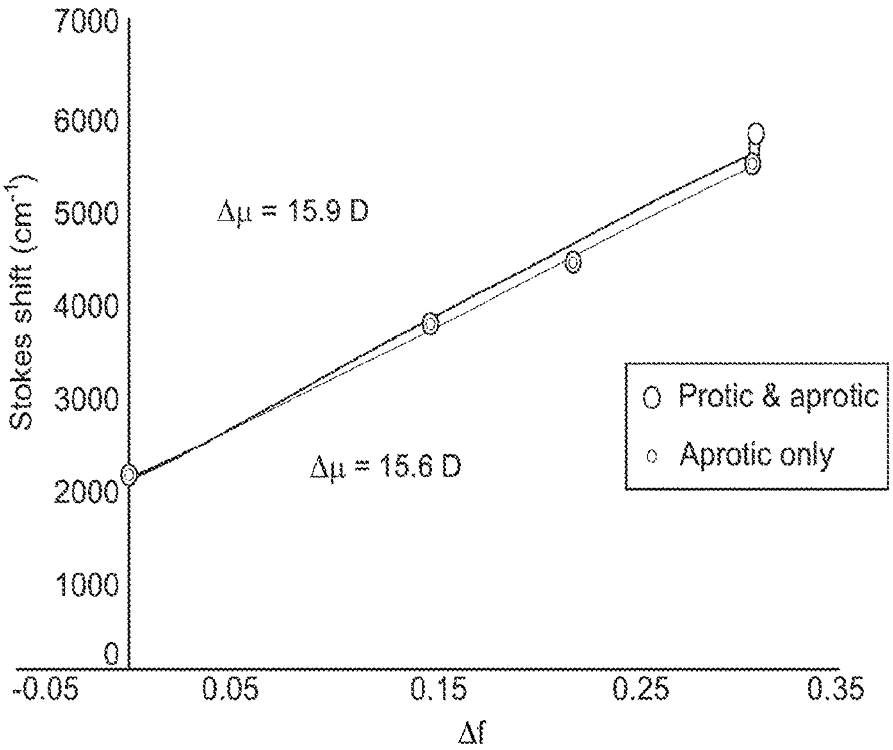
FIGS. 9A and 9B show the Stokes shift of $Bu_2N$-TTz-Py and $Ph_2N$-TTz-COOH versus Δf, respectively.
Figure 9B:
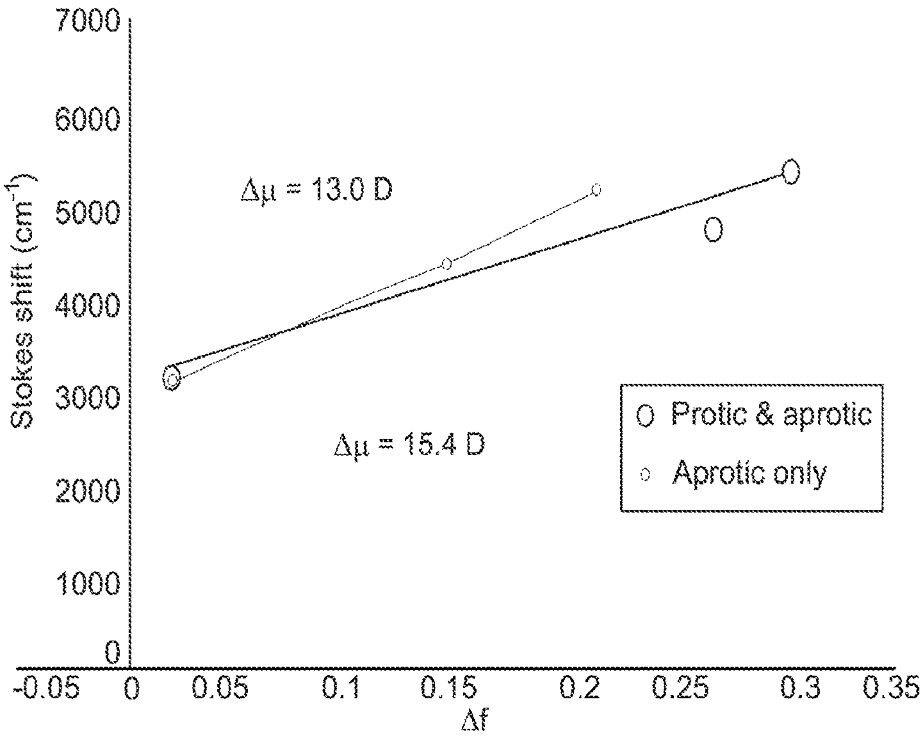

FIGS. 9A and 9B show the Stokes shift of $Bu_2N$-TTz-Py and $Ph_2N$-TTz-COOH versus Δf, respectively. From the slopes of the Lippert-Mataga plots, the change between the dipole moments of the ground and excited states can be determined. Even though the Lippert-Mataga equation assumes no specific solvent-solute interactions (e.g. hydrogen bonding) and ignores solute polarizability, high degrees of linearity are apparent; and therefore, the estimations of the excited state dipoles are regarded as reliable. $Bu_2N$-TTz-Py, in particular, shows a near unity correlation with Lippert-Mataga theory, thus suggesting minimal specific solvent-solute interactions and/or relatively rapid vibrational relaxation as compared to solvent relaxation. Perhaps owing to the minimal solvent interactions and rapid vibrational relaxation, the estimated changes in dipole moments (Δμ) are remarkably large (Table IV). $Bu_2N$-TTz-Py, for example, has a calculated Δμ=15.9 D and a μ*=24.3 D. Compared to similar small-molecule, push-pull dyes, the asymmetric TTz dyes have some of the largest ever reported Aps—twice that of Prodan and comparable to FRO and 7AHC. Therefore, it is expected that these asymmetric TTzs dyes would be well suited to give high sensitivity in sensing applications whereby small changes in the polarity of the environment can lead to large differences in the wavelengths of fluorescence.

TABLE IV

Ground and Excited State Dipole Moments

| Compound | Onsager Cavity Radius a (Å)[a] | Ground State Dipole μ (D)[a] | Excited State Dipole μ* (D)[b] | Change in Dipole Δμ (D)[b] |
|---|---|---|---|---|
| $Bu_2N$-TTz-Py | 6.17 | 8.34 | 24.3 | 15.9 |
| $Ph_2N$-TTz-Py | 6.11 | 6.06 | 20.8 | 14.6 |
| $Ph_2N$-TTz-COOH | 6.16 | 8.36 | 21.3 | 13.0 |
| $Ph_2N$-TTz-CHO | 6.22 | 6.89 | 24.9 | 18.0 |

TABLE IV-continued

| Ground and Excited State Dipole Moments | | | | |
|---|---|---|---|---|
| Compound | Onsager Cavity Radius a (Å)[a] | Ground State Dipole μ (D)[a] | Excited State Dipole μ* (D)[b] | Change in Dipole Δμ (D)[b] |

Figure 10A:
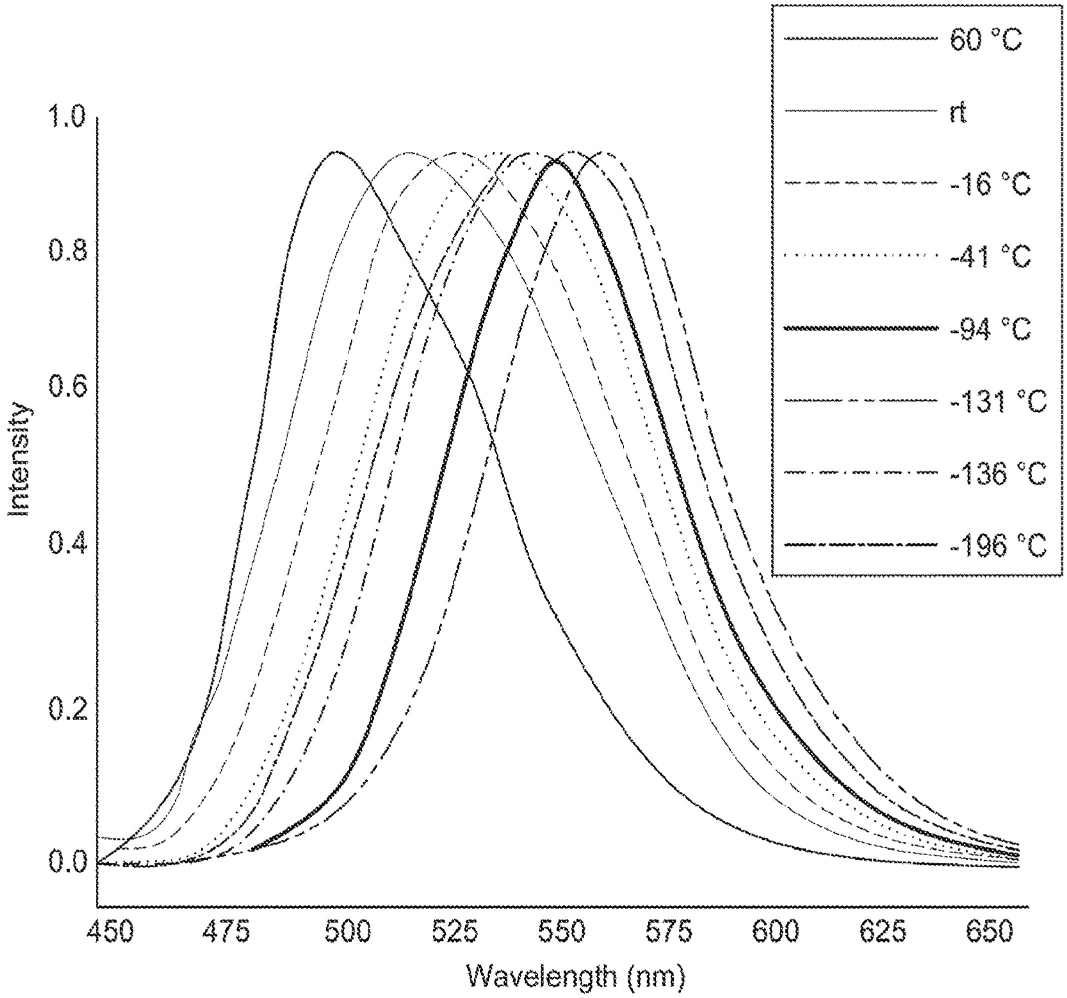
FIG. 10A provides normalized fluorescence emission intensity spectra of $Bu_2N$-TTz-Py.
Figure 10B:
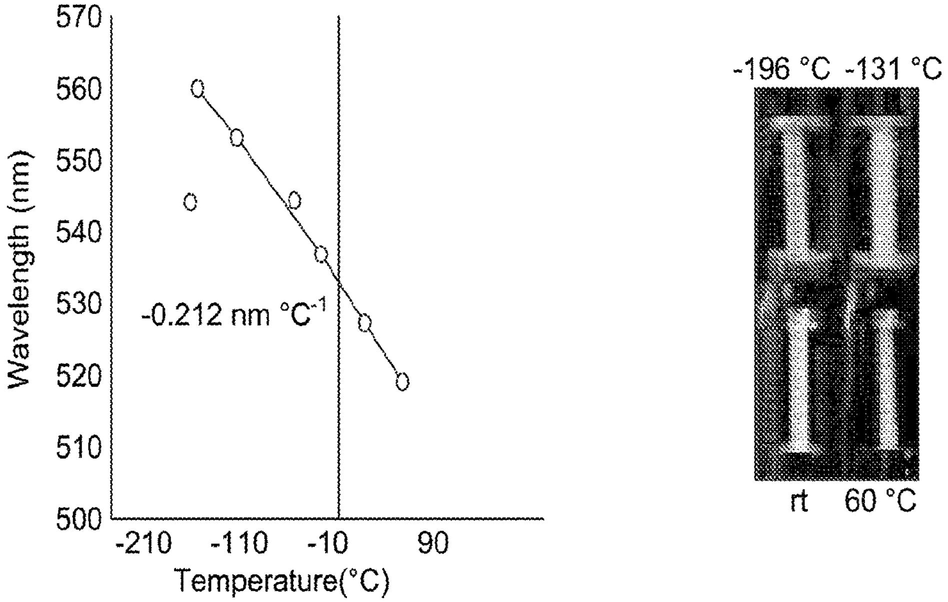
FIG. 10B provides a temperature-wavelength correlation profile of $Bu_2N$-TTz-Py in MeTHF when T>−136° C. and T≤−136° C.

[a]Calculated using DFT B3LYP/6-31G(d) with tight SCF, finegrid integral, and volume keyword
[b]Semi-empirically calculated using the Lippert-Mataga Equation In an extension of sensing the surrounding polarity, the dependence of the wavelength of emission as a function of temperature and pH were also explored. For these efforts, $Bu_2N$-TTz-Py was chosen as a focal representative of the asymmetric TTzs for its solubility, amphiphilicity, high Stokes shifts, and otherwise similar photophysical characteristics. For the temperature studies, a 10 μM MeTHF solution of $Bu_2N$-TTz-Py was prepared and the emission of the solution was monitored from −196-60° C. MeTHF was chosen for its wide liquid temperature window and ability to form a glass upon freezing; most other solvents crystallize upon solidification and inhibit fluorescence. The low temperature studies were achieved using various liquid $N_2$ cooling baths (see Experimental). Due to the condensation of atmospheric moisture during low-temperature testing, only the normalized emission intensities are reported. As seen in FIGS. 10A and 10B. $Bu_2N$-TTz-Py exhibits thermofluorochromism, whereby the wavelength of emission shifts bathochromically as temperature decreases (from 519 nm at 60° C. to 559 nm at −131° C.). At temperatures near the freezing point of MeTHF and below, however, the wavelength of emission rapidly blue-shifts from 559 to 544 to 503 nm at −131, −136, and −196° C., respectively.

As a corollary, any solvent which also dissolves $Bu_2N$-TTz-Py will show a similar temperature affect; however, it is expected that the operable temperature range, sensitivity, and linearity would change correspondingly. Whereas as most dye systems demonstrate a hypsochromic shift upon temperature reduction, $Bu_2N$-TTz-Py demonstrates the opposite trend. General intuition might infer that the direct relationship between viscosity and temperature would likewise lead to faster solvation relaxation at higher temperatures and consequently red-shift the emission spectra. Higher temperatures, however, can also prevent the alignment of solvent dipoles, thus leading to a blue shift in the emission spectra as temperature increases—such as is seen for $Bu_2N$-TTz-Py and, previously, for Laurdan. Furthermore, the hypsochromic shift of the emission that was observed upon freezing is a well-known phenomenon, and can best be attributed to the complete inhibition of solvent relaxation effects upon freezing. Nevertheless, to visualize the temperature dependence of the emission wavelength, a temperature-wavelength correlation profile for $Bu_2N$-TTz-Py in MeTHF was plotted (FIG. 10B). It was observed that the wavelength of emission shows a strong linear correlation with the solution temperature while inside the temperature range in which MeTHF is liquid. Additionally, the TTz/MeTHF solution showed relatively high temperature sensitivity (−0.21 nm ° $C.^{-1}$), thus making it suitable for temperature sensing applications.

Biological Compositions

Figure 11A:
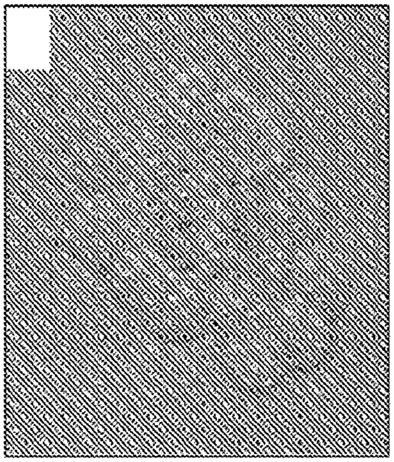
FIGS. 11A and 11B are DIC and fluorescent images, respectively, of HEK 293T cells labelled with 500 nM $Bu_2N$-TTz-Py in PBS buffer containing 0.01% Pluronic F127.
Figure 11B:
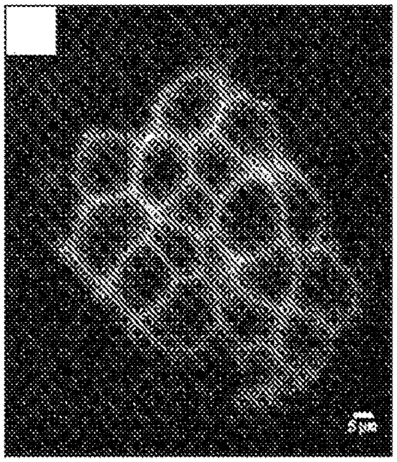
Figure 11C:
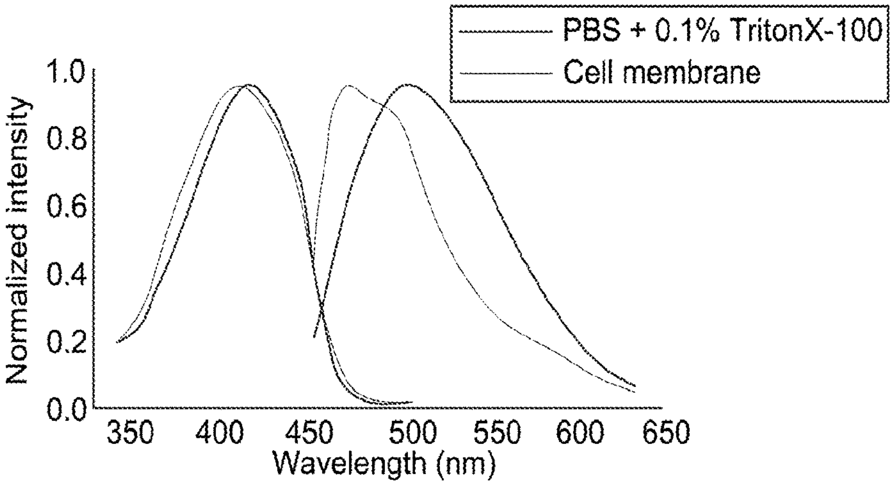
FIG. 11C are normalized excitation/emission spectra of 1 μM $Bu_2N$-TTz-Py in PBS buffer with 0.1% TritonX-100 before and after loading into ~$0.5\times10^5$ J774.A1 cells. Excitation spectra (dashed line) were collected at 520 nm and emission spectra (solid line) were collected with 440 nm excitation.
Figure 11D:
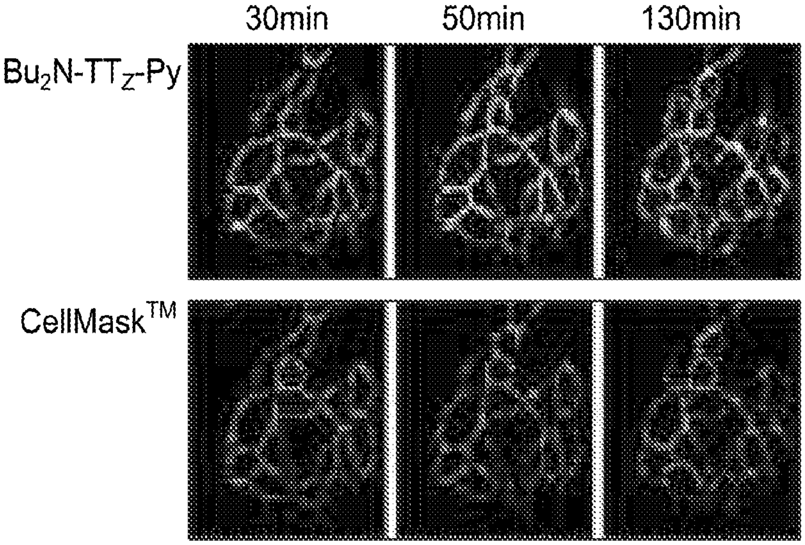
FIG. 11D is a membrane localization study which shows time lapsed images of HEK 293T cells stained with $Bu_2N$-TTz-Py compared to cells stained with CellMask Red™, demonstrating minimal dye internalization over 130 min.
Figure 11E:
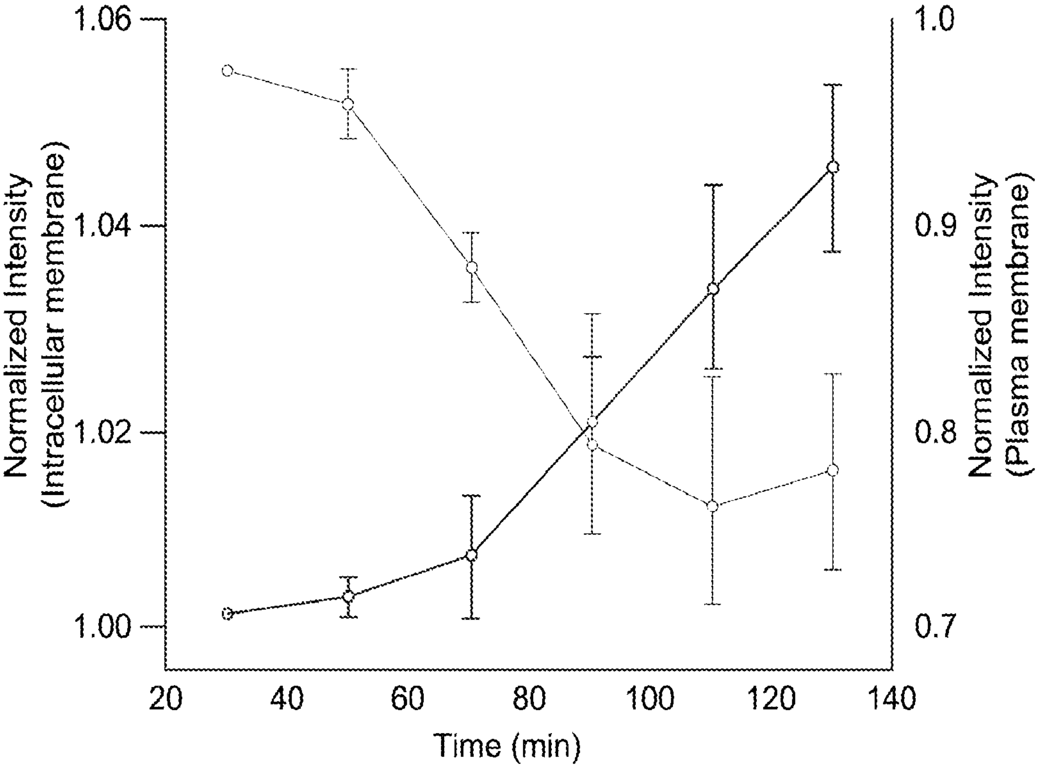
FIG. 11E details quantification of intracellular membrane (circles) and plasma membrane (squares) localization of $Bu_2N$-TTz-Py over time. Error bars represent S.E.M. of 6 independent experiments. Scale bar=10 μm.

Having characterized the sensing capabilities of the asymmetric TTz dyes in solution, their efficacy as biologically relevant sensors was then explored via in vitro cell studies. $Bu_2N$-TTz-Py was selectively chosen based on its expected favorability toward membrane localization given its molecular structure (hydrophilic pyridyl head, hydrophobic dibutylamino tail). As shown in FIGS. 11A and 11B, when $Bu_2N$-TTz-Py is applied to HEK 293T cells, the dye localizes to their cell membranes, displaying peak excitation/emission wavelengths at 423 and 483 nm, respectively (FIG. 11C). Also noteworthy, the wavelength of peak emission for $Bu_2N$-TTz-Py in a solution of PBS with 0.1% Triton-X100 (518 nm) blue-shifts by 34 nm (0.168 eV) upon localizing to a cell membrane. A 0.168 eV blue shift is equivalent to the solvent polarity differential between DCM and toluene, thus further indicating that $Bu_2N$-TTz-Py intercalates between the phospholipid bilayer. Additionally, $Bu_2N$-TTz-Py has both poor solubility and low QY in aqueous environments resulting in low background fluorescence, which is visually apparent by the high amount of contrast between the cell membrane and its surrounding environment (FIG. 11B). More conclusively, FIGS. 5D and 5E show the time lapse imaging and quantification of localization of $Bu_2N$-TTz-Py in HEK 293T cells (6 independent experiments). Normalized against the fluorescence intensity of CellMask™ red, a plasma membrane marker, the fluorescence intensities of the plasma membranes stained with $Bu_2N$-TTz-Py shows a 2.5% decrease after 50 min (26% decrease after 110 min). Given the brevity of the acquisition time (6 acquisitions per cell, 200 ms exposure per acquisition), the overall decrease of the plasma membrane fluorescence intensities of $Bu_2N$-TTz-Py is most likely not caused by photodegradation. Furthermore, the decrease of fluorescence intensities is not caused by dye internalization in any significant capacity since the normalized intensities of intracellular membranes stained with $Bu_2N$-TTz-Py indicate negligible TTz internalization (<1% over 50 min, 5% over 130 min). It is therefore concluded that the majority of the fluorescence reduction after 50 min is caused by extracellular leaching.

Figure 12A:
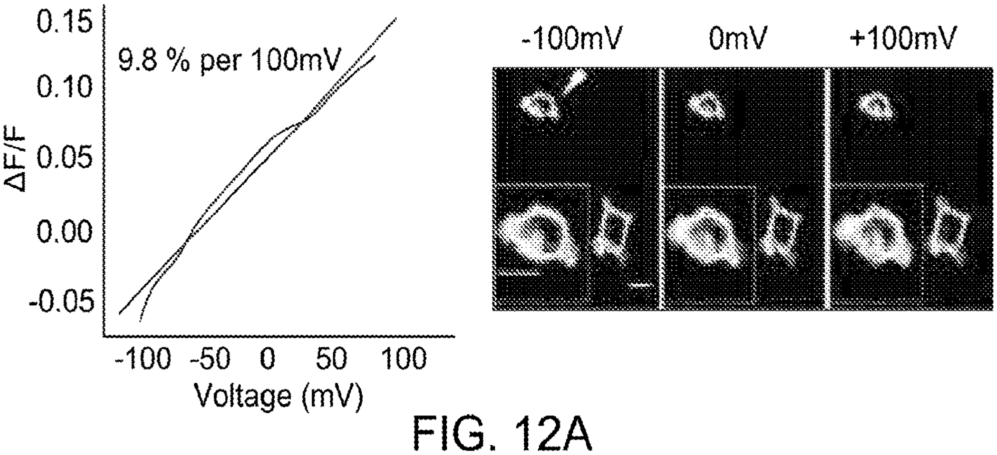
FIG. 12A provides a plot of fractional change in fluorescence (ΔF/F) vs clamped membrane potential of HEK 293T cells labelled with 500 nM $Bu_2N$-Py-TTz and representative pseudo-gray scale images clamped at −100, 0, and +100 mV (shown by white arrow). Inset. Voltage clamped cell.

Having established its environmental sensitivity and proclivity for membrane localization, it was hypothesized that $Bu_2N$-TTz-Py could orient itself favorably within cell membranes and sense voltage differentials across the membrane. To test the membrane voltage sensitivity of $Bu_2N$-TTz-Py, whole-cell patch clamp electrophysiology was performed on HEK 293T cells labeled with 500 nM $Bu_2N$-TTz-Py. As seen in FIG. 12A, cells were held at −60 mV and stepped through 10 mV increments whereby depolarizing or hyperpolarizing voltage potentials resulted in either a florescence increase or decrease, respectively. Tests concluded that $Bu_2N$-TTz-Py has a voltage sensitivity of approximately 10% ΔF/F per 100 mV. For context, early generation VSDs, such as RH-421, ANNINE-6, and VF2.1.Cl, display maximum voltage sensitivities of 10%-25% ΔF/F per 100 mV. In other words, $Bu_2N$-TTz-Py shows a comparatively modest voltage sensitivity relative to comparable VSDs in the literature. It should also be noted that the voltage sensitivities, signal-to-noise, and linearity of VSDs with ICT character (e.g. $Bu_2N$-TTz-Py) can vary significantly depending on both the wavelength of excitation and probed emission.

Figure 12B:
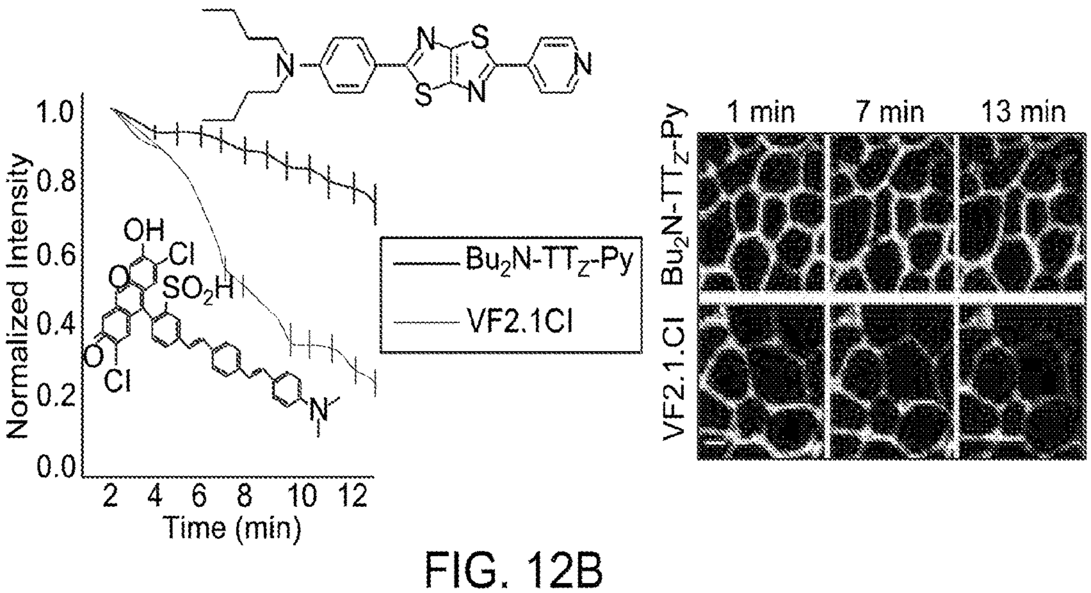
FIG. 12B details photostability of $Bu_2N$-TTz-Py and VF2.1.Cl in HEK 293T cells (illuminated using λ=440 nm at 5 W $cm^2$) and their representative pseudo-gray scale images under continuous illumination at wavelength of maximum excitation. Error bars a/b represent the standard error of mean (S.E.M.) for 3 independent experiments, n=12 total cells. Scale bar=10 μm.

Encouraged by the promising voltage sensitivity data, the photostability of $Bu_2N$-TTz-Py was also tested and found to be much improved over the photostability of VF2.1.Cl (FIG. 12B). Whereas VF2.1.Cl had a bleaching half-life of approximately 7.5 minutes under intense illumination (I=5 W $cm^{-2}$, ε=22,300 $cm^{-1}$ $M^{-1}$ @ 440 nm LED), the fluorescence intensity of $Bu_2N$-TTz-Py decayed by less than 10% in the same amount of time under identical conditions (e=15,000-20,000 $cm^{-1}$ $M^{-1}$ @ 440 nm LED). The improved photostability of $Bu_2N$-TTz-Py over that of VF2.1.Cl can best be attributed to the structural differences between both their head groups and bridging units. It is well known that fluorescein has low photostability and, in the case of VF2.1.Cl, it has been shown that derivitization of its fluorescein head group can drastically improve the photostability. Additionally, p-phenylenevinylene (PPV), i.e. the bridging unit in VF2.1.Cl, has been shown to have photostability issues as well. TTz, on the other hand, has excellent thermo-oxidative and photochemical stability. Furthermore, TTz has the added advantage of requiring only a single condensation step, whereas most other VSDs (including VF2.1.Cl) require multiple synthetic steps. However, the overall yields of the asymmetric TTz dyes in this study remain similar to the overall yields of other VSDs in the literature.

Figure 12C:
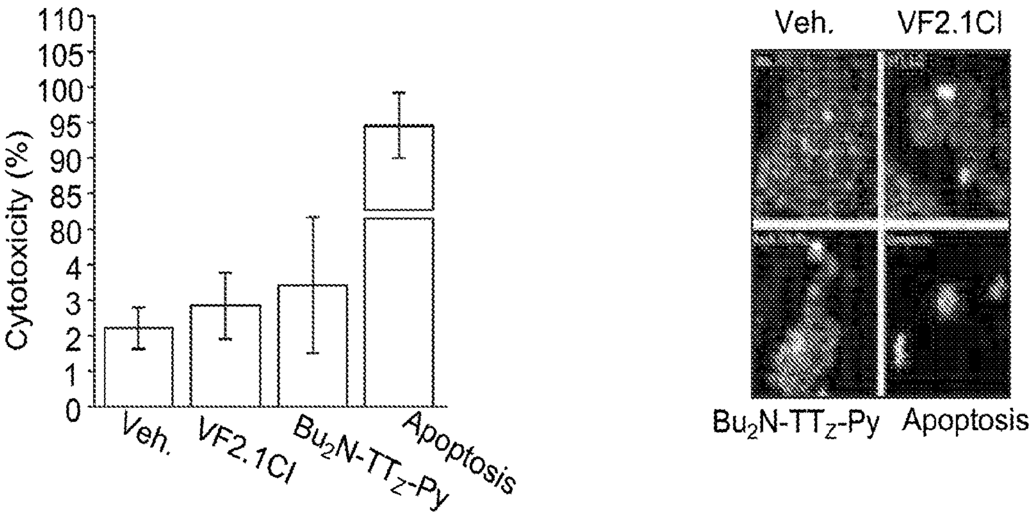
FIG. 12C provides Annexin V-Cy5 staining of HEK 293T cells incubated with DMSO (Veh.), VF2.1.Cl, and $Bu_2N$-TTz-Py. Apoptosis for control (incubated cells 65° C., 10 min). Percentages of cytotoxicity were calculated as number of 100×Cy5 positive cells per number of nuclei stained. Error bars represent S.E.M. of three independent experiments, n=250 cells. Scale bars=10 μm.

Lastly, the cellular toxicities of $Bu_2N$-TTz-Py and VF2.1.Cl were characterized using Annexin V-Cy5 staining of phosphatidylserine. HEK 293T cells were labelled with $Bu_2N$-TTz-Py or VF2.1.Cl for 15 min, incubated with Annexin V-Cy5 for 20 min in the dark, washed, and fixed with 4% paraformaldehyde before imaging. As a positive control, apoptosis was induced via high-temperature incubation (65° C., 10 min). As shown in FIG. 12C, the treatments of $Bu_2N$-TTz-Py or VF2.1.Cl to HEK 293T cells both show insignificant cytotoxicity.

In conclusion, a family of asymmetric TTz dyes was developed which exhibit remarkable solvatofluorochromism as a consequence of the unique structural features provided by the TTz core, namely its enhanced rigidity and planarity in which typical conjugated hydrocarbon bridges do not confer. Spectroscopic studies of these TTz dyes revealed large absorption coefficients, high quantum yields in nonpolar environments, significant Stokes shifts, and red-shifted absorption/emission peaks across a wide solvent range. Lippert-Mataga plots indicated that these TTz dyes have some of the largest dipole moments ever reported ($\Delta\mu$=13-18 D)—double that of Prodan and comparable to FRO and 7AHC. Additionally, we showed that the remarkable photophysical properties of the fused, bicyclic thiazolothiazole it-bridge make them ideal for polarity and/or temperature sensing applications. Furthermore, electrophysiology studies indicated promising voltage sensitivities, negligible cytotoxicity, and photostabilities 4-fold higher than that of VF2.1.Cl. Thus, the strong ICT character and remarkable photophysical properties of these new asymmetric TTz dyes make them attractive for a wide range of sensing applications.

Materials and Instrumentation.

4-pyridine carboxaldehyde, 4-(dibutylamino)benzaldehyde, 4-(diphenylamino)benzaldehyde, terephthalaldehyde, dithiooxamide, and all solvents used for spectroscopic measurements were purchased from Sigma-Aldrich and used without further purification. $^1H$ and $^{13}C$NMR measurements were obtained with either a JEOL 300 MHz NMR or a JEOL 500 MHz NMR. High resolution mass spectra were obtained using a Thermo Fisher Scientific MSQ Plus Single Quadrupole Mass Spectrometer. Solution-state UV-Vis spectra were collected on a Cary 300 UV-Vis spectrophotometer. Time-resolved measurements were taken on a Jobin Yvon-Spex Fluorolog equipped with a 389 nm diode laser for time-resolved PL decay measurements. Igor Pro 6.3 software was used to fit PL(t) decay data to single/multiple exponential decays. Quantum yields were calculated using 9,10-diphenylanthracene as a reference (quantum yield [$\Phi_F$] in cyclohexane=0.97).[40-41] Density functional theory (DFT) calculations were performed with Spartan computational software using B3LYP[42-43] density functional and 6-31G*[44] basis set. Temperature studies were conducted using a 10 μM $Bu_2N$-TTz-Py MeTHF solution placed inside of a Norrell 502 NMR tube and sequentially submerged in the following liquid $N_2$ baths:octanol (−16° C.), acetonitrile (−41° C.), acetone (−94° C.), pentane (−131° C.), MeTHF (−136° C.), and liquid $N_2$ itself (−196° C.). The phosphorescence spectrum of $Bu_2N$-TTz-Py (see S2) was collected similarly at −196° C. by pumping with 389 nm light while inside a liquid nitrogen bath and then probing the emission within 2 sec of removing from the bath. Human embryonic kidney cells (HEK 293T) were a kind gift from Prof. Bryan Dickinson, and Mouse macrophage J774A.1 cells were a kind gift from Prof. Deborah Nelson at the University of Chicago. Cells were cultured in Dulbecco's Modified Eagle's Medium (Invitrogen Corporation, USA) containing 10% heat inactivated Fetal Bovine Serum (FBS) (Invitrogen Corporation, USA), 100 U/mL penicillin, and 100 μg/mL streptomycin. Cells were maintained at 37° C. under 5% $CO_2$.

Cell labeled spectral measurements. Excitation and emission spectra were collected by labeling the alveolar macrophage cell line J774.A1 (~$0.5\times10^5$ cells) with 1 μM $Bu_2N$-TTz-Py in phosphate buffered saline (PBS) buffer and 0.1% TritonX-100. Cells were incubated with dye for 10 min at RT, washed thrice with PBS, and dispersed in a cuvette for fluorescent spectral measurements (Fluoromax-4, Horiba Scientific, Edison, NJ, USA). Excitation spectra were collected at 520 nm emission. Emission spectra were collected by exciting at 440 nm. Electrophysiology. Whole cell voltage clamping measurements of 500 nM $Bu_2N$-TTz-Py labeled HEK 293T cells were performed with Axopatch 200A amplifier (Molecular Devices), digitized using an NI-6251 DAQ (National Instruments), and controlled using WinWCP software (Strathclyde Electrophysiology Software). Patch pipettes were pulled using a Sutter P-97 Micropipette puller. Patch pipettes with resistances between 5-10 MOhm were used in voltage clamping experiments. The patch pipette was positioned using an MP325 motorized manipulator (Sutter). Metamorph premier Ver. 7.8.12.0 was linked to an NI-6501 DAQ to enable voltage triggered image acquisition. Extracellular solution composition was 145 mM NaCl, 20 mM glucose, 10 mM HEPES, pH 7.4, 3 mM KCl, 2 mM $CaCl_2$), 1 mM $MgCl_2$ (310 mOsm); and the intracellular solution composition was 115 mM potassium gluconate, 10 mM EGTA tetrapotassium salt, 10 mM HEPES, pH 7.2, 5 mM NaCl, 10 mM KCl, 2 mM ATP disodium salt (290 mOsm).

Microscopy. Imaging was carried out on an IX83 inverted microscope (Olympus Corporation of the Americas, Center Valley, PA, USA) using 100×, 1.4 NA, DIC oil immersion objective (PLAPON, Olympus) and an Evolve Delta 512 EMCCD camera (Photometrics, USA). Filter wheel, shutter, and CCD camera were controlled using Metamorph premier Ver 7.8.12.0 (Molecular Devices, LLC, USA). For photostability studies, HEK 293T cells were labeled with 500 nM $Bu_2N$-TTz-Py and illuminated continuously with ~5 W $cm^{-2}$ power light source, periodically acquiring images at 1 min interval. $Bu_2N$-TTz-Py channel images were obtained using 480/20 bandpass excitation filter, 575/40 bandpass emission filter and 89016 dichroic. VF2.1.Cl channel images were obtained using 500/20 bandpass excitation filter, 535/40 bandpass emission filter and 69002 dichroic. For CellMask™ red, images were obtained using the 640/30 bandpass excitation filter, 705/72 bandpass emission filter and 89016 dichroic.

Cellular localization: Time-lapse imaging was performed to probe the membrane localization of $Bu_2N$-TTz-Py at longer time scale. HEK 293T cells were labelled with 500 nM $Bu_2N$-TTz-Py and a plasma membrane marker (IX CellMask™ red, Thermo Fisher) for 10 min in 1×HBSS (Hank's balanced salt solution, Thermo Fisher). Excess unbound dyes were washed with 1×PBS and imaged after 30 min incubation in 1×HBSS. The membrane localized $Bu_2N$-TTz-Py and CellMask™ Red were sequentially imaged every 20 min. Intensity values at plasma membrane ($I_{PM}$) were calculated by drawing regions of interest (ROI) around the whole cell and subtracting intracellular intensity ($I_{IM}$, ROI drawn within the cell) for $Bu_2N$-TTz-Py and CellMask images, respectively. The normalized intensity ratio of $Bu_2N$-TTz-Py to CellMask™ red, at plasma membrane ($I_{PM}$ ratio) and intracellular membrane (IIM ratio), were plotted with respect to time. Cytotoxicity: Cellular toxicity of voltage sensitive dyes was characterized using Annexin V-Cy5 (BioVision) staining of phosphatidylserine that are exposed to outer leaflet of plasma membrane during apoptosis. HEK 293T cells were labelled with 500 nM of indicated dyes for 15 min, followed by incubation with Annexin V-Cy5 for 20 min in dark and washed, fixed with 4% paraformaldehyde before imaging. As a positive control, unlabeled HEK cells were incubated at 65° C. for 10 min to induce apoptosis and stained with Annexin V-Cy5 as above. Cytotoxicity percentage is calculated as number of Annexin V-Cy5 positive cells to total number of nuclear stained cells. Number of cells quantification were performed using Analyze particle function of ImageJ program.

2-(N,N-dibutyl-4-aminophenyl)-5-(4-pyridyl) thiazolo[5,4-d]thiazole ($Bu_2N$-TTz-Py): 4-Pyridinecarboxaldehyde (1.3401 g, 12.511 mmol), dithiooxamide (1.0007 g, 8.3253 mmol), and 4-(dibutylamino)benzaldehyde (2.9108 g, 12.474 mmol) were mixed in 40 mL anhydrous DMF for 6 h at 120° C. After refrigerating overnight, a brownish-yellow powder precipitate was collected via vacuum filtration and rinsed with DMSO and water (1.374 g). Using a 1:1 hexanes:chloroform mixture, 31.4 mg of the crude product was purified by silica gel column chromatography (Silica Flash M60). The eluent was removed under vacuum, thereby yielding a yellow solid (2.3 mg, 2.9%). $^1H$ NMR (500 MHz, $CD_3CN$, δ): 8.67 (d, J=5.05 Hz, 2H), 7.84 (d, J=6.20 Hz, 2H), 7.79 (d, J=9.15 Hz, 2H), 6.74 (d, J=9.90 Hz, 2H). $^{13}C$ NMR (126 MHz, DCM, protonated): 202.19, 197.48, 152.01, 142.06, 142.03. 141.96, 141.94, 129.87, 128.65, 121.66. UV-Vis $\lambda_{max}$ ($CHCl_3$, $M^{-1}$ $cm^{-1}$): 424 nm (ε=17, 700). ESI-MS: calcd for $C_{23}H_{27}N_4S_2^+$, 423.1677; found, 423.1659.

2-(N,N-diphenyl-4-aminophenyl)-5-(4-pyridyl) thiazolo[5,4-d]thiazole ($Ph_2N$-TTz-Py): 4-Pyridinecarboxaldehyde (0.2577 g, 2.406 mmol), dithiooxamide (0.2519 g, 2.0957 mmol), and 4-(diphenylamino)benzaldehyde (0.8634 g, 3.159 mmol) were mixed in 10 mL anhydrous DMF for 6 h at 120° C. After sitting overnight, a brownish-yellow precipitate was collected via vacuum filtration and rinsed with water (0.3201 g). Using chloroform, 20.0 mg of the crude product was purified by silica gel column chromatography (Silica Flash M60). The eluent was removed under vacuum, thereby yielding a yellow solid (15.6 mg, 25.8%). $^1H$ NMR (500 MHz, d-DMSO, δ): 8.72 (d, J=5.48 Hz, 2H), 7.93 (d, J=6.40 Hz, 2H), 7.89 (d, J=8.70 Hz, 2H), 7.36 (m, 4H), 7.13 (m, 6H), 6.95 (d, J=9.15 Hz, 2H). $^{13}C$ NMR (126 MHz, DCM, protonated): 206.41, 152.86, 151.16, 150.83, 148.69, 148.63, 146.70, 129.61, 127.64, 126.21, 126.21, 125.76, 121.12, 120.28. UV-Vis $\lambda_{max}$ ($CHCl_3$, $M^{-1}$ $cm^{-1}$): 424 nm (ε=46,400). ESI-MS: calcd for $C_{27}H_{19}N_4S_2^+$, 463.1051; found, 463.0524.

2-(N,N-diphenyl-4-aminophenyl)-5-(4-carboxyphenyl) thiazolo[5,4-d]thiazole ($Ph_2N$-TTz-COOH): 4-Formylbenzoic acid (0.3774 g, 2.514 mmol), dithiooxamide (0.2002 g, 1.666 mmol), and 4-(diphenylamino)benzaldehyde (0.6820 g, 2.495 mmol) were mixed in 16 mL anhydrous DMF for 6 h at 120° C. The reaction mixture was cooled overnight, whereby a brownish-yellow solid precipitated out of solution. The precipitate was collected via vacuum filtration and rinsed with water (0.7044 g). Using chloroform, 21.7 mg of the precipitate was purified by silica gel column chromatography (Silica Flash M60). A yellow solid (6.3 mg, 24.3%) was collected after chromatographic separation. $^1H$ NMR (500 MHz, d-DMSO, δ): 8.10 (d, J=8.70 Hz, 2H), 8.05 (d, J=8.70 Hz, 2H), 7.88 (d, J=8.70 Hz, 2H), 7.37 (m, 4H), 7.14 (m, 6H), 6.96 (d, J=8.70 Hz, 2H). $^{13}C$ NMR (126 MHz, DCM): 203.15, 146.97, 146.79, 144.46, 144.02, 136.09, 132.34, 130.33, 129.59, 127.47, 126.62, 125.66, 124.34, 122.90, 121.32. UV-Vis $\lambda_{max}$ ($CHCl_3$, $M^{-1}$ $cm^{-1}$): 424 nm (ε=13,900). ESI-MS: calcd for $C_{29}H_{19}N_3O_2S_2$, 505.0919; found, 505.0991.

2-(N,N-diphenyl-4-aminophenyl)-5-(4-formylphenyl) thiazolo[5,4-d]thiazole ($Ph_2N$-TTz-CHO): Terephthalaldehyde (0.3343 g, 2.49 mmol), dithiooxamide (0.2007 g, 1.67 mmol), and 4-(Diphenylamino)benzaldehyde (0.6824 g, 2.50 mmol), were refluxed in 10 mL of DMF for 6 h under aerobic conditions. The reaction mixture was allowed to sit overnight, and the precipitated product was collected by gravity filtration and rinsed with water (0.5046 g). A portion of the product (0,1994 g) was then purified by column chromatography on silica gel using hexanes/dichloromethane (10:1, 4:1) as eluent yielding a yellow solid (17.0 mg, 2.1%). $^1H$ NMR (300 MHz, DCM, δ): 10.03 (s, 1H), 8.15 (d, J=8.26 Hz, 2H), 7.95 (d, J=8.52 Hz, 2H) 7.82 (d, J=8.79 Hz, 2H), 7.31 (t, J=8.79 Hz, 4H), 7.13 (t, J=7.95 Hz, 6H), 7.05 (d, J=8.79 Hz, 2H). $^{13}C$ NMR (126 MHz, DCM): 191.29, 165.94, 152.09, 150.87, 150.56, 146.80, 141.11, 129.13, 137.36, 130.31, 129.59, 127.47, 126.61, 125.66, 124.33, 121.33. UV-vis $\lambda_{max}$ (DCM, ε=$M^{-1}$ $cm^{-1}$): 434 nm (ε=35, 100) ESI-MS: calcd for $C_{29}H_{20}N_3OS_2^+$: 490.1048; found, 490.1456.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A π-conjugated asymmetric molecular dye of Formula I:

(I)

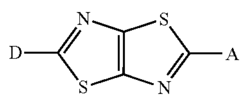

wherein D is an electron donor and A is an electron acceptor, the π-conjugated asymmetric molecular dye having a difference between the highest occupied molecular orbital (HOMO) and lowest unoccupied molecular orbital (LUMO) of at least 1.2 eV.

2. The π-conjugated asymmetric molecular dye of claim 1, wherein the difference between the HOMO and LUMO is 1.2 eV to 5 eV.

3. The π-conjugated asymmetric molecular dye of claim 1, wherein A comprises an aryl or heteroaryl moiety.

4. The π-conjugated asymmetric molecular dye of claim 1, wherein the dye is a fluorophore.

5. The π-conjugated asymmetric molecular dye of claim 4, wherein the dye has a solvent dependent fluorescence lifetime.

6. The π-conjugated asymmetric molecular dye of claim 1 having a peak absorption from 400 nm to 450 nm.

7. The π-conjugated asymmetric molecular dye of claim 1 having a peak emission from 450 nm to 650 nm.

8. The π-conjugated asymmetric molecular dye of claim 1 wherein the dye exhibits solvatofluorochromism.

9. The π-conjugated asymmetric molecular dye of claim 8 having a Stokes shift of 0.25 eV to 0.75 eV.

10. The π-conjugated asymmetric molecular dye of claim 4 having a quantum yield in non-polar solvent of at least 80 percent.

11. The π-conjugated asymmetric molecular dye of claim 1 exhibiting a change in dipole moment between ground and excited states of 12 D to 20 D.

12. The π-conjugated asymmetric molecular dye of claim 4, wherein fluorescence of the dye increases or decreases relative to voltage changes in a local environment of the dye.

13. The π-conjugated asymmetric molecular dye of claim 1, wherein the dye is amphiphilic.

* * * * *